United States Patent
Ahn et al.

(10) Patent No.: US 8,785,312 B2
(45) Date of Patent: Jul. 22, 2014

(54) CONDUCTIVE LAYERS FOR HAFNIUM SILICON OXYNITRIDE

(75) Inventors: Kie Y. Ahn, Chappaqua, NY (US); Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/305,338

(22) Filed: Nov. 28, 2011

(65) Prior Publication Data

US 2012/0068272 A1    Mar. 22, 2012

Related U.S. Application Data

(60) Continuation of application No. 12/772,473, filed on May 30, 2010, now Pat. No. 8,067,794, which is a division of application No. 11/355,490, filed on Feb. 16, 2006, now Pat. No. 7,709,402.

(51) Int. Cl.
| | | |
|---|---|---|
| *H01L 21/28* | (2006.01) | |
| *H01L 21/314* | (2006.01) | |
| *H01L 29/788* | (2006.01) | |
| *C23C 16/30* | (2006.01) | |

(52) U.S. Cl.
CPC ........ *H01L 21/3141* (2013.01); *H01L 29/7881* (2013.01); *C23C 16/30* (2013.01)
USPC ........... 438/591; 438/785; 438/786; 438/791; 257/310; 257/389; 257/E21.19

(58) Field of Classification Search
CPC ............ H01L 21/3141; H01L 29/7881; H01L 21/318; H01L 29/51; H01L 21/31645; H01L 28/40; C23C 16/30; C23C 16/45529; C23C 16/45531
USPC ........... 438/591, 785, 786, 791; 257/E21.19, 257/369, 296, 310
See application file for complete search history.

(56) References Cited

U.S. PATENT DOCUMENTS

| | | |
|---|---|---|
| 3,381,114 A | 4/1968 | Nakanuma |
| 3,407,479 A | 10/1968 | Fordemwalt et al. |

(Continued)

FOREIGN PATENT DOCUMENTS

| | | |
|---|---|---|
| EP | 1096042 A1 | 5/2001 |
| EP | 1124262 A2 | 8/2001 |

(Continued)

OTHER PUBLICATIONS

"International Technology for Semiconductor Roadmap, 1999 edition", Semiconductor Industry Association, [Online]. Retrieved from the Internet: <URL: http://public.itrs.net/Files/2001ITRS/Links/1999_SIA_Roadmap/>, (1999), 371 pgs.

(Continued)

*Primary Examiner* — Thinh T Nguyen
(74) *Attorney, Agent, or Firm* — Schwegman, Lundberg & Woessner, P.A.

(57) ABSTRACT

Electronic apparatus and methods of forming the electronic apparatus include HfSiON for use in a variety of electronic systems. In various embodiments, conductive material is coupled to a dielectric containing HfSiON, where such conductive material may include one or more monolayers of titanium nitride, tantalum, or combinations of titanium nitride and tantalum.

17 Claims, 3 Drawing Sheets

(56) References Cited

U.S. PATENT DOCUMENTS

| | | |
|---|---|---|
| 3,641,516 A | 2/1972 | Casrucci et al. |
| 3,665,423 A | 5/1972 | Nakanuma et al. |
| 3,830,657 A | 8/1974 | Farrar |
| 3,865,654 A | 2/1975 | Chang et al. |
| 3,877,054 A | 4/1975 | Boulin et al. |
| 3,964,085 A | 6/1976 | Kahng et al. |
| 4,058,430 A | 11/1977 | Suntola et al. |
| 4,152,627 A | 5/1979 | Priel et al. |
| 4,173,791 A | 11/1979 | Bell |
| 4,215,156 A | 7/1980 | Dalal et al. |
| 4,217,601 A | 8/1980 | DeKeersmaecker et al. |
| 4,333,808 A | 6/1982 | Bhattacharyya et al. |
| 4,389,973 A | 6/1983 | Suntola et al. |
| 4,399,424 A | 8/1983 | Rigby |
| 4,413,022 A | 11/1983 | Suntola et al. |
| 4,435,896 A | 3/1984 | Parrillo et al. |
| 4,507,673 A | 3/1985 | Aoyama et al. |
| 4,542,870 A | 9/1985 | Howell |
| 4,590,042 A | 5/1986 | Drage |
| 4,647,947 A | 3/1987 | Takeoka et al. |
| 4,661,833 A | 4/1987 | Mizutani |
| 4,745,082 A | 5/1988 | Kwok |
| 4,767,641 A | 8/1988 | Kieser et al. |
| 4,811,078 A | 3/1989 | Tigelaar |
| 4,814,854 A | 3/1989 | Tigelaar et al. |
| 4,888,733 A | 12/1989 | Mobley |
| 4,894,801 A | 1/1990 | Saito et al. |
| 4,920,071 A | 4/1990 | Thomas |
| 4,931,411 A | 6/1990 | Tigelaar et al. |
| 4,939,559 A | 7/1990 | DiMaria et al. |
| 4,993,358 A | 2/1991 | Mahawili |
| 4,994,404 A | 2/1991 | Sheng et al. |
| 5,006,192 A | 4/1991 | Deguchi |
| 5,016,215 A | 5/1991 | Tigelaar |
| 5,017,977 A | 5/1991 | Richardson |
| 5,021,999 A | 6/1991 | Kohda et al. |
| 5,027,171 A | 6/1991 | Reedy et al. |
| 5,042,011 A | 8/1991 | Casper et al. |
| 5,049,516 A | 9/1991 | Arima |
| 5,080,928 A | 1/1992 | Klinedinst et al. |
| 5,111,430 A | 5/1992 | Morie |
| 5,153,144 A | 10/1992 | Komori et al. |
| 5,158,986 A | 10/1992 | Cha et al. |
| 5,192,589 A | 3/1993 | Sandhu |
| 5,198,029 A | 3/1993 | Dutta et al. |
| 5,246,881 A | 9/1993 | Sandhu et al. |
| 5,253,196 A | 10/1993 | Shimabukuro et al. |
| 5,262,199 A | 11/1993 | Desu et al. |
| 5,274,249 A | 12/1993 | Xi et al. |
| 5,280,205 A | 1/1994 | Green et al. |
| 5,293,560 A | 3/1994 | Harari |
| 5,298,447 A | 3/1994 | Hong |
| 5,303,182 A | 4/1994 | Nakao et al. |
| 5,317,535 A | 5/1994 | Talreja et al. |
| 5,334,356 A | 8/1994 | Baldwin et al. |
| 5,341,016 A | 8/1994 | Prall et al. |
| 5,388,069 A | 2/1995 | Kokubo |
| 5,391,510 A | 2/1995 | Hsu et al. |
| 5,399,379 A | 3/1995 | Sandhu |
| 5,399,516 A | 3/1995 | Bergendahl et al. |
| 5,401,609 A | 3/1995 | Haratani et al. |
| 5,409,859 A | 4/1995 | Glass et al. |
| 5,410,504 A | 4/1995 | Ward |
| 5,424,993 A | 6/1995 | Lee et al. |
| 5,426,603 A | 6/1995 | Nakamura et al. |
| 5,430,670 A | 7/1995 | Rosenthal |
| 5,434,815 A | 7/1995 | Smarandoiu et al. |
| 5,438,544 A | 8/1995 | Makino |
| 5,449,941 A | 9/1995 | Yamazaki et al. |
| 5,457,649 A | 10/1995 | Eichman et al. |
| 5,467,306 A | 11/1995 | Kaya et al. |
| 5,477,485 A | 12/1995 | Bergemont et al. |
| 5,485,422 A | 1/1996 | Bauer et al. |
| 5,493,140 A | 2/1996 | Iguchi |
| 5,498,507 A | 3/1996 | Handa et al. |
| 5,504,376 A | 4/1996 | Sugahara et al. |
| 5,508,543 A | 4/1996 | Hartstein et al. |
| 5,508,544 A | 4/1996 | Shah |
| 5,530,581 A | 6/1996 | Cogan |
| 5,530,668 A | 6/1996 | Chern et al. |
| 5,539,279 A | 7/1996 | Takeuchi et al. |
| 5,541,871 A | 7/1996 | Nishimura et al. |
| 5,541,872 A | 7/1996 | Lowrey et al. |
| 5,550,770 A | 8/1996 | Kuroda |
| 5,572,052 A | 11/1996 | Kashihara et al. |
| 5,572,459 A | 11/1996 | Wilson et al. |
| 5,589,413 A | 12/1996 | Sung et al. |
| 5,593,912 A | 1/1997 | Rajeevakumar |
| 5,595,606 A | 1/1997 | Fujikawa et al. |
| 5,600,587 A | 2/1997 | Koike |
| 5,602,777 A | 2/1997 | Nawaki et al. |
| 5,627,781 A | 5/1997 | Hayashi et al. |
| 5,627,785 A | 5/1997 | Gilliam et al. |
| 5,659,057 A | 8/1997 | Vaartstra |
| 5,670,790 A | 9/1997 | Katoh et al. |
| 5,674,563 A | 10/1997 | Tarui et al. |
| 5,677,867 A | 10/1997 | Hazani |
| 5,698,022 A | 12/1997 | Glassman et al. |
| 5,714,766 A | 2/1998 | Chen et al. |
| 5,735,960 A | 4/1998 | Sandhu et al. |
| 5,740,104 A | 4/1998 | Forbes |
| 5,742,471 A | 4/1998 | Barbee, Jr. et al. |
| 5,747,116 A | 5/1998 | Sharan et al. |
| 5,754,477 A | 5/1998 | Forbes |
| 5,768,192 A | 6/1998 | Eitan |
| 5,795,808 A | 8/1998 | Park |
| 5,801,105 A | 9/1998 | Yano et al. |
| 5,801,401 A | 9/1998 | Forbes |
| 5,810,923 A | 9/1998 | Yano et al. |
| 5,822,256 A | 10/1998 | Bauer et al. |
| 5,825,046 A | 10/1998 | Czubatyj et al. |
| 5,828,080 A | 10/1998 | Yano et al. |
| 5,828,113 A | 10/1998 | Chen et al. |
| 5,828,605 A | 10/1998 | Peng et al. |
| 5,840,897 A | 11/1998 | Kirlin et al. |
| 5,852,306 A | 12/1998 | Forbes |
| 5,856,688 A | 1/1999 | Lee et al. |
| 5,866,205 A | 2/1999 | Vaartstra et al. |
| 5,886,368 A | 3/1999 | Forbes et al. |
| 5,891,773 A | 4/1999 | Saitoh |
| 5,891,797 A | 4/1999 | Farrar |
| 5,906,874 A | 5/1999 | Takahashi et al. |
| 5,912,488 A | 6/1999 | Kim et al. |
| 5,916,365 A | 6/1999 | Sherman |
| 5,920,121 A | 7/1999 | Forbes et al. |
| 5,923,056 A | 7/1999 | Lee et al. |
| 5,936,274 A | 8/1999 | Forbes et al. |
| 5,943,262 A | 8/1999 | Choi |
| 5,950,925 A | 9/1999 | Fukunaga et al. |
| 5,959,896 A | 9/1999 | Forbes |
| 5,960,270 A | 9/1999 | Misra et al. |
| 5,965,323 A | 10/1999 | Takahashi et al. |
| 5,972,430 A | 10/1999 | DiMeo, Jr. et al. |
| 5,973,356 A | 10/1999 | Noble et al. |
| 5,981,014 A | 11/1999 | Tsukagoshi et al. |
| 5,981,350 A | 11/1999 | Geusic et al. |
| 5,989,958 A | 11/1999 | Forbes |
| 5,990,559 A | 11/1999 | Marsh |
| 5,991,225 A | 11/1999 | Forbes et al. |
| 5,994,777 A | 11/1999 | Farrar |
| 6,002,418 A | 12/1999 | Yoneda et al. |
| 6,005,790 A | 12/1999 | Chan et al. |
| 6,010,969 A | 1/2000 | Vaartstra |
| 6,011,725 A | 1/2000 | Eitan |
| 6,013,553 A | 1/2000 | Wallace et al. |
| 6,020,024 A | 2/2000 | Maiti et al. |
| 6,020,243 A | 2/2000 | Wallace et al. |
| 6,025,225 A | 2/2000 | Forbes et al. |
| 6,027,961 A | 2/2000 | Maiti et al. |
| 6,030,679 A | 2/2000 | Saito et al. |
| 6,031,263 A | 2/2000 | Forbes et al. |
| 6,034,882 A | 3/2000 | Johnson et al. |
| 6,049,479 A | 4/2000 | Thurgate et al. |
| 6,051,486 A | 4/2000 | Gardner |

(56) References Cited

U.S. PATENT DOCUMENTS

| | | |
|---|---|---|
| 6,057,271 A | 5/2000 | Kenjiro et al. |
| 6,059,885 A | 5/2000 | Ohashi et al. |
| 6,063,705 A | 5/2000 | Vaartstra |
| 6,072,209 A | 6/2000 | Noble et al. |
| 6,077,792 A | 6/2000 | Farrar |
| 6,080,646 A | 6/2000 | Wang |
| 6,081,034 A | 6/2000 | Sandhu et al. |
| 6,081,287 A | 6/2000 | Noshita et al. |
| 6,083,836 A | 7/2000 | Rodder |
| 6,087,067 A | 7/2000 | Kato et al. |
| 6,087,674 A | 7/2000 | Ovshinsky et al. |
| 6,090,636 A | 7/2000 | Geusic et al. |
| 6,100,176 A | 8/2000 | Forbes et al. |
| 6,103,330 A | 8/2000 | Kosuda et al. |
| 6,107,656 A | 8/2000 | Igarashi |
| 6,110,529 A | 8/2000 | Gardiner et al. |
| 6,115,281 A | 9/2000 | Aggarwal et al. |
| 6,121,126 A | 9/2000 | Ahn et al. |
| 6,122,201 A | 9/2000 | Lee et al. |
| 6,124,729 A | 9/2000 | Noble et al. |
| 6,125,062 A | 9/2000 | Ahn et al. |
| 6,134,175 A | 10/2000 | Forbes et al. |
| 6,136,168 A | 10/2000 | Masujima et al. |
| 6,140,181 A | 10/2000 | Forbes et al. |
| 6,141,237 A | 10/2000 | Eliason et al. |
| 6,141,238 A | 10/2000 | Forbes et al. |
| 6,141,260 A | 10/2000 | Ahn et al. |
| 6,143,582 A | 11/2000 | Vu et al. |
| 6,143,636 A | 11/2000 | Forbes et al. |
| 6,143,655 A | 11/2000 | Forbes et al. |
| 6,150,188 A | 11/2000 | Geusic et al. |
| 6,150,687 A | 11/2000 | Noble et al. |
| 6,153,355 A | 11/2000 | Takahashi et al. |
| 6,153,468 A | 11/2000 | Forbes et al. |
| 6,160,739 A | 12/2000 | Wong |
| 6,161,500 A | 12/2000 | Kopacz et al. |
| 6,166,401 A | 12/2000 | Forbes |
| 6,171,900 B1 | 1/2001 | Sun |
| 6,174,377 B1 | 1/2001 | Doering et al. |
| 6,175,129 B1 | 1/2001 | Liu et al. |
| 6,175,377 B1 | 1/2001 | Noshita et al. |
| 6,185,122 B1 | 2/2001 | Johnson et al. |
| 6,191,448 B1 | 2/2001 | Forbes et al. |
| 6,194,228 B1 | 2/2001 | Fujiki et al. |
| 6,197,628 B1 | 3/2001 | Vaartstra et al. |
| 6,198,168 B1 | 3/2001 | Geusic et al. |
| 6,200,893 B1 | 3/2001 | Sneh |
| 6,203,613 B1 | 3/2001 | Gates et al. |
| 6,204,172 B1 | 3/2001 | Marsh |
| 6,206,972 B1 | 3/2001 | Dunham |
| 6,211,035 B1 | 4/2001 | Moise et al. |
| 6,212,103 B1 | 4/2001 | Ahrens et al. |
| 6,214,662 B1 | 4/2001 | Sung et al. |
| 6,217,645 B1 | 4/2001 | Vaartstra |
| 6,218,293 B1 | 4/2001 | Kraus et al. |
| 6,222,768 B1 | 4/2001 | Hollmer et al. |
| 6,225,168 B1 | 5/2001 | Gardner et al. |
| 6,225,237 B1 | 5/2001 | Vaartstra |
| 6,232,643 B1 | 5/2001 | Forbes et al. |
| 6,238,976 B1 | 5/2001 | Noble et al. |
| 6,243,300 B1 | 6/2001 | Sunkavalli |
| 6,246,606 B1 | 6/2001 | Forbes et al. |
| 6,249,020 B1 | 6/2001 | Forbes et al. |
| 6,252,793 B1 | 6/2001 | Allen et al. |
| 6,255,683 B1 | 7/2001 | Radens et al. |
| 6,256,052 B1 | 7/2001 | Yoneda |
| 6,256,053 B1 | 7/2001 | Noshita et al. |
| 6,269,023 B1 | 7/2001 | Derhacobian et al. |
| 6,271,131 B1 | 8/2001 | Uhlenbrock et al. |
| 6,273,951 B1 | 8/2001 | Vaartstra |
| 6,274,937 B1 | 8/2001 | Ahn et al. |
| 6,277,693 B1 | 8/2001 | Chen |
| 6,281,042 B1 | 8/2001 | Ahn et al. |
| 6,281,144 B1 | 8/2001 | Cleary et al. |
| 6,284,646 B1 | 9/2001 | Leem |
| 6,291,340 B1 | 9/2001 | Sandhu et al. |
| 6,291,341 B1 | 9/2001 | Sharan et al. |
| 6,291,866 B1 | 9/2001 | Wallace et al. |
| 6,294,813 B1 | 9/2001 | Forbes et al. |
| 6,297,103 B1 | 10/2001 | Ahn et al. |
| 6,297,539 B1 | 10/2001 | Ma et al. |
| 6,300,203 B1 | 10/2001 | Buynoski et al. |
| 6,302,964 B1 | 10/2001 | Umotoy et al. |
| 6,303,481 B2 | 10/2001 | Park |
| 6,310,376 B1 | 10/2001 | Ueda et al. |
| 6,313,035 B1 | 11/2001 | Sandhu et al. |
| 6,313,518 B1 | 11/2001 | Ahn et al. |
| 6,317,357 B1 | 11/2001 | Forbes |
| 6,320,784 B1 | 11/2001 | Muralidhar et al. |
| 6,320,786 B1 | 11/2001 | Chang et al. |
| 6,323,081 B1 | 11/2001 | Marsh |
| 6,325,017 B1 | 12/2001 | DeBoer et al. |
| 6,333,255 B1 | 12/2001 | Sekiguchi |
| 6,337,704 B1 | 1/2002 | Yamaguchi |
| 6,337,805 B1 | 1/2002 | Forbes et al. |
| 6,338,880 B1 | 1/2002 | Akram |
| 6,342,277 B1 | 1/2002 | Sherman |
| 6,346,477 B1 | 2/2002 | Kaloyeros et al. |
| 6,348,386 B1 | 2/2002 | Gilmer |
| 6,350,704 B1 | 2/2002 | Ahn et al. |
| 6,351,276 B1 | 2/2002 | Yamaguchi |
| 6,351,411 B2 | 2/2002 | Forbes et al. |
| 6,353,554 B1 | 3/2002 | Banks |
| 6,358,766 B1 | 3/2002 | Kasahara |
| 6,360,685 B1 | 3/2002 | Xia et al. |
| 6,365,470 B1 | 4/2002 | Maeda |
| 6,365,519 B2 | 4/2002 | Kraus et al. |
| 6,368,941 B1 | 4/2002 | Chen et al. |
| 6,380,579 B1 | 4/2002 | Nam et al. |
| 6,381,168 B2 | 4/2002 | Forbes |
| 6,383,873 B1 | 5/2002 | Hegde et al. |
| 6,383,955 B1 | 5/2002 | Matsuki et al. |
| 6,387,712 B1 | 5/2002 | Yano et al. |
| 6,391,769 B1 | 5/2002 | Lee et al. |
| 6,399,491 B2 | 6/2002 | Jeon et al. |
| 6,399,979 B1 | 6/2002 | Noble et al. |
| 6,407,435 B1 | 6/2002 | Ma et al. |
| 6,410,432 B1 | 6/2002 | Hautala et al. |
| 6,418,050 B2 | 7/2002 | Forbes |
| 6,420,279 B1 | 7/2002 | Ono et al. |
| 6,423,619 B1 | 7/2002 | Grant et al. |
| 6,429,063 B1 | 8/2002 | Eitan |
| 6,429,065 B2 | 8/2002 | Forbes |
| 6,432,779 B1 | 8/2002 | Hobbs et al. |
| 6,434,041 B2 | 8/2002 | Forbes |
| 6,438,031 B1 | 8/2002 | Fastow |
| 6,441,417 B1 | 8/2002 | Zhang et al. |
| 6,444,039 B1 | 9/2002 | Nguyen |
| 6,444,592 B1 | 9/2002 | Ballantine et al. |
| 6,444,895 B1 | 9/2002 | Nikawa |
| 6,445,023 B1 | 9/2002 | Vaartstra et al. |
| 6,445,030 B1 | 9/2002 | Wu et al. |
| 6,448,192 B1 | 9/2002 | Kaushik |
| 6,449,188 B1 | 9/2002 | Fastow |
| 6,451,641 B1 | 9/2002 | Halliyal et al. |
| 6,454,912 B1 | 9/2002 | Ahn et al. |
| 6,455,717 B1 | 9/2002 | Vaartstra |
| 6,456,531 B1 | 9/2002 | Wang et al. |
| 6,456,536 B1 | 9/2002 | Sobek et al. |
| 6,458,701 B1 | 10/2002 | Chae et al. |
| 6,459,618 B1 | 10/2002 | Wang |
| 6,461,970 B1 | 10/2002 | Yin |
| 6,465,298 B2 | 10/2002 | Forbes et al. |
| 6,465,306 B1 | 10/2002 | Ramsbey et al. |
| 6,465,334 B1 | 10/2002 | Buynoski et al. |
| 6,468,924 B2 | 10/2002 | Lee et al. |
| 6,475,276 B1 | 11/2002 | Elers et al. |
| 6,476,434 B1 | 11/2002 | Noble et al. |
| 6,482,733 B2 | 11/2002 | Raaijmakers et al. |
| 6,482,740 B2 | 11/2002 | Soininen et al. |
| 6,485,988 B2 | 11/2002 | Ma et al. |
| 6,486,027 B1 | 11/2002 | Noble et al. |
| 6,486,047 B2 | 11/2002 | Lee et al. |
| 6,486,703 B2 | 11/2002 | Noble et al. |

(56) References Cited

U.S. PATENT DOCUMENTS

| | | |
|---|---|---|
| 6,487,121 B1 | 11/2002 | Thurgate et al. |
| 6,490,204 B2 | 12/2002 | Bloom et al. |
| 6,490,205 B1 | 12/2002 | Wang et al. |
| 6,492,233 B2 | 12/2002 | Forbes et al. |
| 6,492,659 B1 | 12/2002 | Yamazaki et al. |
| 6,492,694 B2 | 12/2002 | Noble et al. |
| 6,495,436 B2 | 12/2002 | Ahn et al. |
| 6,498,063 B1 | 12/2002 | Ping |
| 6,498,065 B1 | 12/2002 | Forbes et al. |
| 6,498,362 B1 | 12/2002 | Forbes et al. |
| 6,500,756 B1 | 12/2002 | Bell et al. |
| 6,504,224 B1 | 1/2003 | Ahn et al. |
| 6,504,755 B1 | 1/2003 | Katayama et al. |
| 6,509,280 B2 | 1/2003 | Choi |
| 6,514,820 B2 | 2/2003 | Ahn et al. |
| 6,514,828 B2 | 2/2003 | Ahn et al. |
| 6,515,510 B2 | 2/2003 | Noble et al. |
| 6,518,615 B1 | 2/2003 | Geusic et al. |
| 6,521,911 B2 | 2/2003 | Parsons et al. |
| 6,521,950 B1 | 2/2003 | Shimabukuro et al. |
| 6,521,958 B1 | 2/2003 | Forbes et al. |
| 6,524,952 B1 | 2/2003 | Srinivas et al. |
| 6,526,191 B1 | 2/2003 | Geusic et al. |
| 6,527,866 B1 | 3/2003 | Matijasevic et al. |
| 6,531,192 B2 | 3/2003 | Akram |
| 6,531,354 B2 | 3/2003 | Maria et al. |
| 6,534,357 B1 | 3/2003 | Basceri |
| 6,534,395 B2 | 3/2003 | Werkhoven et al. |
| 6,534,420 B2 | 3/2003 | Ahn et al. |
| 6,534,868 B2 | 3/2003 | Sekiguchi |
| 6,537,613 B1 | 3/2003 | Senzaki et al. |
| 6,537,901 B2 | 3/2003 | Cha et al. |
| 6,538,330 B1 | 3/2003 | Forbes |
| 6,541,079 B1 | 4/2003 | Bojarczuk, Jr. et al. |
| 6,541,280 B2 | 4/2003 | Kaushik et al. |
| 6,541,816 B2 | 4/2003 | Ramsbey et al. |
| 6,541,859 B1 | 4/2003 | Forbes et al. |
| 6,544,846 B2 | 4/2003 | Ahn et al. |
| 6,544,875 B1 | 4/2003 | Wilk |
| 6,545,314 B2 | 4/2003 | Forbes et al. |
| 6,548,405 B2 | 4/2003 | Kraus et al. |
| 6,551,399 B1 | 4/2003 | Sneh et al. |
| 6,551,893 B1 | 4/2003 | Zheng et al. |
| 6,552,383 B2 | 4/2003 | Ahn et al. |
| 6,552,387 B1 | 4/2003 | Eitan |
| 6,555,879 B1 | 4/2003 | Krivokapic et al. |
| 6,559,014 B1 | 5/2003 | Jeon |
| 6,559,017 B1 | 5/2003 | Brown et al. |
| 6,559,491 B2 | 5/2003 | Forbes et al. |
| 6,562,491 B1 | 5/2003 | Jeon |
| 6,566,699 B2 | 5/2003 | Eitan |
| 6,567,303 B1 | 5/2003 | Hamilton et al. |
| 6,567,312 B1 | 5/2003 | Torii et al. |
| 6,570,248 B1 | 5/2003 | Ahn et al. |
| 6,570,787 B1 | 5/2003 | Wang et al. |
| 6,573,169 B2 | 6/2003 | Noble et al. |
| 6,576,053 B1 | 6/2003 | Kim et al. |
| 6,580,118 B2 | 6/2003 | Ludwig et al. |
| 6,580,124 B1 | 6/2003 | Cleeves et al. |
| 6,586,349 B1 * | 7/2003 | Jeon et al. .................... 438/785 |
| 6,586,785 B2 | 7/2003 | Flagan et al. |
| 6,596,583 B2 | 7/2003 | Agarwal et al. |
| 6,597,037 B1 | 7/2003 | Forbes et al. |
| 6,599,781 B1 | 7/2003 | Li |
| 6,603,328 B2 | 8/2003 | Takahashi et al. |
| 6,605,514 B1 | 8/2003 | Tabery et al. |
| 6,605,549 B2 | 8/2003 | Leu et al. |
| 6,608,378 B2 | 8/2003 | Ahn et al. |
| 6,613,656 B2 | 9/2003 | Li |
| 6,613,695 B2 | 9/2003 | Pomarede et al. |
| 6,614,079 B2 | 9/2003 | Lee |
| 6,617,634 B2 | 9/2003 | Marsh et al. |
| 6,617,639 B1 | 9/2003 | Wang et al. |
| 6,618,290 B1 | 9/2003 | Wang et al. |
| 6,620,670 B2 | 9/2003 | Song et al. |
| 6,624,517 B1 | 9/2003 | Sandhu |
| 6,627,503 B2 | 9/2003 | Ma et al. |
| 6,630,201 B2 | 10/2003 | Chiang et al. |
| 6,630,381 B1 | 10/2003 | Hazani |
| 6,630,391 B2 | 10/2003 | Agarwal et al. |
| 6,630,718 B1 | 10/2003 | Trivedi |
| 6,632,279 B1 | 10/2003 | Ritala et al. |
| 6,632,736 B2 | 10/2003 | Sandhu et al. |
| 6,635,939 B2 | 10/2003 | Agarwal et al. |
| 6,639,267 B2 | 10/2003 | Eldridge |
| 6,642,573 B1 | 11/2003 | Halliyal et al. |
| 6,645,682 B2 * | 11/2003 | Park et al. .................... 430/20 |
| 6,645,882 B1 * | 11/2003 | Halliyal et al. ............... 438/785 |
| 6,656,282 B2 | 12/2003 | Kim et al. |
| 6,660,660 B2 | 12/2003 | Haukka et al. |
| 6,661,058 B2 | 12/2003 | Ahn et al. |
| 6,664,154 B1 | 12/2003 | Bell et al. |
| 6,670,284 B2 | 12/2003 | Yin |
| 6,673,701 B1 | 1/2004 | Marsh et al. |
| 6,674,109 B1 | 1/2004 | Fujimori et al. |
| 6,674,138 B1 | 1/2004 | Halliyal et al. |
| 6,689,660 B1 | 2/2004 | Noble et al. |
| 6,696,332 B2 | 2/2004 | Visokay et al. |
| 6,699,747 B2 | 3/2004 | Ruff et al. |
| 6,709,978 B2 | 3/2004 | Geusic et al. |
| 6,709,989 B2 | 3/2004 | Ramdani et al. |
| 6,710,538 B1 | 3/2004 | Ahn et al. |
| 6,713,846 B1 | 3/2004 | Senzaki |
| 6,714,455 B2 | 3/2004 | Banks |
| 6,720,221 B1 | 4/2004 | Ahn et al. |
| 6,723,577 B1 | 4/2004 | Geusic et al. |
| 6,723,642 B1 | 4/2004 | Lim et al. |
| 6,727,169 B1 | 4/2004 | Raaijmakers et al. |
| 6,727,560 B1 | 4/2004 | Pan et al. |
| 6,730,163 B2 | 5/2004 | Vaartstra |
| 6,730,164 B2 | 5/2004 | Vaartstra et al. |
| 6,730,575 B2 | 5/2004 | Eldridge |
| 6,737,317 B2 | 5/2004 | Marsh et al. |
| 6,750,066 B1 | 6/2004 | Cheung et al. |
| 6,750,126 B1 | 6/2004 | Visokay et al. |
| 6,753,567 B2 | 6/2004 | Maria et al. |
| 6,754,108 B2 | 6/2004 | Forbes |
| 6,756,298 B2 | 6/2004 | Ahn et al. |
| 6,759,081 B2 | 7/2004 | Huganen et al. |
| 6,762,081 B2 | 7/2004 | Yamazaki et al. |
| 6,762,114 B1 | 7/2004 | Chambers |
| 6,764,901 B2 | 7/2004 | Noble |
| 6,767,582 B1 | 7/2004 | Elers |
| 6,767,795 B2 | 7/2004 | Ahn et al. |
| 6,770,521 B2 | 8/2004 | Visokay et al. |
| 6,770,923 B2 | 8/2004 | Nguyen et al. |
| 6,774,050 B2 | 8/2004 | Ahn et al. |
| 6,777,715 B1 | 8/2004 | Geusic et al. |
| 6,778,441 B2 | 8/2004 | Forbes et al. |
| 6,780,704 B1 | 8/2004 | Raaijmakers et al. |
| 6,783,591 B1 | 8/2004 | Halliyal et al. |
| 6,784,049 B2 | 8/2004 | Vaartstra |
| 6,784,101 B1 | 8/2004 | Yu et al. |
| 6,784,515 B1 | 8/2004 | Li |
| 6,787,370 B2 | 9/2004 | Forbes |
| 6,787,413 B2 | 9/2004 | Ahn |
| 6,790,791 B2 | 9/2004 | Ahn et al. |
| 6,794,284 B2 | 9/2004 | Vaartstra |
| 6,794,709 B2 | 9/2004 | Ahn et al. |
| 6,800,173 B2 | 10/2004 | Chiang et al. |
| 6,803,326 B2 | 10/2004 | Ahn et al. |
| 6,804,136 B2 | 10/2004 | Forbes |
| 6,806,211 B2 | 10/2004 | Shinriki et al. |
| 6,809,370 B1 * | 10/2004 | Colombo et al. ............. 257/310 |
| 6,812,100 B2 | 11/2004 | Ahn et al. |
| 6,812,139 B2 | 11/2004 | Givens et al. |
| 6,812,157 B1 | 11/2004 | Gadgil |
| 6,812,513 B2 | 11/2004 | Geusic et al. |
| 6,812,516 B2 | 11/2004 | Noble, Jr. et al. |
| 6,812,517 B2 | 11/2004 | Baker |
| 6,818,519 B2 | 11/2004 | Fang et al. |
| 6,818,937 B2 | 11/2004 | Noble et al. |
| 6,821,862 B2 | 11/2004 | Cho |
| 6,821,873 B2 | 11/2004 | Visokay et al. |

(56) References Cited

U.S. PATENT DOCUMENTS

| | | | |
|---|---|---|---|
| 6,828,632 B2 | 12/2004 | Bhattacharyya |
| 6,830,983 B2 | 12/2004 | Marsh |
| 6,831,315 B2 | 12/2004 | Raaijmakers et al. |
| 6,833,285 B1 | 12/2004 | Ahn et al. |
| 6,833,308 B2 | 12/2004 | Ahn et al. |
| 6,835,111 B2 | 12/2004 | Ahn et al. |
| 6,838,764 B2 | 1/2005 | Farrar |
| 6,844,203 B2 | 1/2005 | Ahn et al. |
| 6,844,604 B2 | 1/2005 | Lee et al. |
| 6,849,546 B1 | 2/2005 | Tu et al. |
| 6,852,645 B2 | 2/2005 | Colombo et al. |
| 6,858,120 B2 | 2/2005 | Ahn et al. |
| 6,858,444 B2 | 2/2005 | Ahn et al. |
| 6,858,865 B2 | 2/2005 | Ahn et al. |
| 6,863,725 B2 | 3/2005 | Vaartstra et al. |
| 6,864,164 B1 | 3/2005 | Dakshina-Murthy et al. |
| 6,867,097 B1 | 3/2005 | Ramsbey et al. |
| 6,872,671 B2 | 3/2005 | Farrar |
| 6,873,020 B2 | 3/2005 | Misra et al. |
| 6,873,539 B1 | 3/2005 | Fazan et al. |
| 6,879,017 B2 | 4/2005 | Ahn et al. |
| 6,881,667 B2 | 4/2005 | Sandhu et al. |
| 6,884,719 B2 | 4/2005 | Chang et al. |
| 6,884,739 B2 | 4/2005 | Ahn et al. |
| 6,888,739 B2 | 5/2005 | Forbes |
| 6,890,847 B1 | 5/2005 | Farrar |
| 6,893,984 B2 | 5/2005 | Ahn et al. |
| 6,900,122 B2 | 5/2005 | Ahn et al. |
| 6,908,849 B2 | 6/2005 | Derraa |
| 6,909,156 B2 | 6/2005 | Aoyama |
| 6,911,381 B2 | 6/2005 | Agarwal et al. |
| 6,914,800 B2 | 7/2005 | Ahn et al. |
| 6,916,398 B2 | 7/2005 | Chen et al. |
| 6,919,266 B2 | 7/2005 | Ahn et al. |
| 6,919,273 B1 | 7/2005 | Otsuki et al. |
| 6,921,702 B2 | 7/2005 | Ahn et al. |
| 6,930,346 B2 | 8/2005 | Ahn et al. |
| 6,936,508 B2 | 8/2005 | Visokay et al. |
| 6,949,433 B1 | 9/2005 | Hidehiko et al. |
| 6,953,730 B2 | 10/2005 | Ahn et al. |
| 6,953,743 B2 | 10/2005 | Sandhu et al. |
| 6,958,300 B2 | 10/2005 | Vaartstra et al. |
| 6,958,302 B2 | 10/2005 | Ahn et al. |
| 6,960,538 B2 | 11/2005 | Ahn et al. |
| 6,967,154 B2 | 11/2005 | Meng et al. |
| 6,967,159 B2 | 11/2005 | Vaartstra |
| 6,970,370 B2 | 11/2005 | Forbes |
| 6,979,623 B2 | 12/2005 | Rotondaro et al. |
| 6,979,855 B2 | 12/2005 | Ahn et al. |
| 6,984,591 B1 | 1/2006 | Buchanan et al. |
| 6,984,592 B2 | 1/2006 | Vaartstra |
| 6,989,573 B2 | 1/2006 | Ahn et al. |
| 6,995,081 B2 | 2/2006 | Vaartstra |
| 6,996,009 B2 | 2/2006 | Forbes |
| 6,999,298 B2 | 2/2006 | Hackler et al. |
| 7,012,311 B2 | 3/2006 | Ohmi et al. |
| 7,014,903 B2 | 3/2006 | Takasaki et al. |
| 7,015,534 B2 | 3/2006 | Colombo |
| 7,018,933 B2 | 3/2006 | Kim et al. |
| 7,019,351 B2 | 3/2006 | Eppich et al. |
| 7,026,694 B2 | 4/2006 | Ahn et al. |
| 7,030,042 B2 | 4/2006 | Vaartstra et al. |
| 7,033,869 B1 | 4/2006 | Xiang et al. |
| 7,037,574 B2 | 5/2006 | Paranjpe et al. |
| 7,037,862 B2 | 5/2006 | Ahn et al. |
| 7,041,609 B2 | 5/2006 | Vaartstra |
| 7,045,430 B2 | 5/2006 | Ahn et al. |
| 7,045,431 B2 | 5/2006 | Rotondaro et al. |
| 7,049,192 B2 | 5/2006 | Ahn et al. |
| 7,057,244 B2 | 6/2006 | Andreoni et al. |
| 7,064,058 B2 | 6/2006 | Ahn et al. |
| 7,068,544 B2 | 6/2006 | Forbes et al. |
| 7,077,902 B2 | 7/2006 | Vaartstra |
| 7,081,421 B2 | 7/2006 | Ahn et al. |
| 7,084,078 B2 | 8/2006 | Ahn et al. |
| 7,087,481 B2 | 8/2006 | Vaartstra et al. |
| 7,091,119 B2 | 8/2006 | Colombo |
| 7,101,813 B2 | 9/2006 | Ahn et al. |
| 7,112,485 B2 | 9/2006 | Vaartstra |
| 7,112,494 B2 | 9/2006 | Forbes |
| 7,113,429 B2 | 9/2006 | Forbes |
| 7,115,166 B2 | 10/2006 | Vaartstra et al. |
| 7,115,528 B2 | 10/2006 | Vaartstra et al. |
| 7,115,530 B2 | 10/2006 | Quevedo-Lopez et al. |
| 7,118,942 B1 | 10/2006 | Li |
| 7,122,464 B2 | 10/2006 | Vaartstra |
| 7,125,815 B2 | 10/2006 | Vaartstra |
| 7,129,553 B2 | 10/2006 | Ahn et al. |
| 7,130,220 B2 | 10/2006 | Forbes |
| 7,133,315 B2 | 11/2006 | Forbes |
| 7,135,361 B2 | 11/2006 | Visokay et al. |
| 7,135,369 B2 | 11/2006 | Ahn et al. |
| 7,135,370 B2 | 11/2006 | Baker |
| 7,135,421 B2 | 11/2006 | Ahn et al. |
| 7,141,278 B2 | 11/2006 | Koh et al. |
| 7,144,825 B2 | 12/2006 | Adetutu et al. |
| 7,148,546 B2 | 12/2006 | Visokay et al. |
| 7,154,118 B2 | 12/2006 | Lindert et al. |
| 7,154,140 B2 | 12/2006 | Forbes |
| 7,160,577 B2 | 1/2007 | Ahn et al. |
| 7,160,597 B2 | 1/2007 | Inoue et al. |
| 7,160,817 B2 | 1/2007 | Marsh |
| 7,161,894 B2 | 1/2007 | Judge |
| 7,166,509 B2 | 1/2007 | Forbes |
| 7,169,673 B2 | 1/2007 | Ahn et al. |
| 7,176,076 B2 | 2/2007 | Chambers et al. |
| 7,183,186 B2 | 2/2007 | Ahn et al. |
| 7,192,824 B2 | 3/2007 | Ahn et al. |
| 7,192,892 B2 | 3/2007 | Ahn et al. |
| 7,193,893 B2 | 3/2007 | Forbes |
| 7,195,999 B2 | 3/2007 | Forbes et al. |
| 7,196,007 B2 | 3/2007 | Vaartstra |
| 7,199,023 B2 | 4/2007 | Ahn et al. |
| 7,205,218 B2 | 4/2007 | Ahn et al. |
| 7,205,620 B2 | 4/2007 | Ahn et al. |
| 7,208,793 B2 | 4/2007 | Bhattacharyya |
| 7,208,804 B2 | 4/2007 | Ahn et al. |
| 7,211,492 B2 | 5/2007 | Forbes et al. |
| 7,214,416 B2 | 5/2007 | Nakai et al. |
| 7,214,994 B2 | 5/2007 | Forbes et al. |
| 7,221,017 B2 | 5/2007 | Forbes et al. |
| 7,221,586 B2 | 5/2007 | Forbes et al. |
| 7,226,830 B2 | 6/2007 | Colombo et al. |
| 7,235,501 B2 | 6/2007 | Ahn et al. |
| 7,235,854 B2 | 6/2007 | Ahn et al. |
| 7,250,367 B2 | 7/2007 | Vaartstra et al. |
| 7,253,122 B2 | 8/2007 | Vaartstra |
| 7,265,427 B2 * | 9/2007 | Kaneko et al. ................ 257/410 |
| 7,271,077 B2 | 9/2007 | Vaartstra et al. |
| 7,279,732 B2 | 10/2007 | Meng et al. |
| 7,291,526 B2 | 11/2007 | Li |
| 7,294,556 B2 | 11/2007 | Vaartstra |
| 7,300,870 B2 | 11/2007 | Vaartstra |
| 7,323,424 B2 | 1/2008 | Ahn et al. |
| 7,332,442 B2 | 2/2008 | Vaartstra et al. |
| 7,365,027 B2 | 4/2008 | Ahn et al. |
| 7,368,402 B2 | 5/2008 | Vaartstra |
| 7,374,617 B2 | 5/2008 | Vaartstra |
| 7,374,964 B2 | 5/2008 | Ahn et al. |
| 7,375,403 B2 * | 5/2008 | Kaneko et al. ................ 257/410 |
| 7,390,756 B2 | 6/2008 | Ahn et al. |
| 7,393,736 B2 | 7/2008 | Ahn et al. |
| 7,399,666 B2 | 7/2008 | Ahn et al. |
| 7,410,910 B2 | 8/2008 | Ahn et al. |
| 7,410,918 B2 | 8/2008 | Vaartstra |
| 7,432,548 B2 | 10/2008 | Forbes et al. |
| 7,494,939 B2 | 2/2009 | Ahn et al. |
| 7,498,247 B2 | 3/2009 | Ahn et al. |
| 7,508,648 B2 | 3/2009 | Ahn et al. |
| 7,510,983 B2 | 3/2009 | Ahn et al. |
| 7,544,604 B2 | 6/2009 | Forbes et al. |
| 7,547,952 B2 * | 6/2009 | Metzner et al. ................ 257/411 |
| 7,560,395 B2 | 7/2009 | Ahn |
| 7,563,730 B2 | 7/2009 | Forbes et al. |

(56) References Cited

U.S. PATENT DOCUMENTS

| | | |
|---|---|---|
| 7,572,695 B2 | 8/2009 | Ahn et al. |
| 7,582,161 B2 | 9/2009 | Ahn et al. |
| 7,588,988 B2 | 9/2009 | Ahn et al. |
| 7,592,251 B2 | 9/2009 | Ahn et al. |
| 7,601,649 B2 | 10/2009 | Ahn et al. |
| 7,605,030 B2 | 10/2009 | Forbes et al. |
| 7,615,438 B2 | 11/2009 | Ahn et al. |
| 7,662,729 B2 | 2/2010 | Ahn et al. |
| 7,687,409 B2 | 3/2010 | Ahn et al. |
| 7,727,908 B2 | 6/2010 | Ahn et al. |
| 8,067,794 B2 | 11/2011 | Ahn et al. |
| 2001/0002280 A1 | 5/2001 | Sneh |
| 2001/0003667 A1 | 6/2001 | Ahn et al. |
| 2001/0005625 A1 | 6/2001 | Sun et al. |
| 2001/0009383 A1 | 7/2001 | Nakayama et al. |
| 2001/0009695 A1 | 7/2001 | Saanila et al. |
| 2001/0012698 A1 | 8/2001 | Hayashi et al. |
| 2001/0014521 A1 | 8/2001 | Kraus et al. |
| 2001/0014526 A1 | 8/2001 | Clevenger et al. |
| 2001/0019876 A1 | 9/2001 | Juengling et al. |
| 2001/0024387 A1 | 9/2001 | Raaijmakers et al. |
| 2001/0030352 A1 | 10/2001 | Ruf et al. |
| 2001/0032995 A1 | 10/2001 | Maria et al. |
| 2001/0034117 A1 | 10/2001 | Eldridge et al. |
| 2001/0050039 A1 | 12/2001 | Park |
| 2001/0050438 A1 | 12/2001 | Juengling et al. |
| 2002/0001906 A1 | 1/2002 | Park |
| 2002/0001971 A1 | 1/2002 | Cho |
| 2002/0003252 A1 | 1/2002 | Iyer |
| 2002/0004276 A1 | 1/2002 | Ahn et al. |
| 2002/0004277 A1 | 1/2002 | Ahn et al. |
| 2002/0013052 A1 | 1/2002 | Visokay |
| 2002/0019125 A1 | 2/2002 | Juengling et al. |
| 2002/0024080 A1 | 2/2002 | Derderian et al. |
| 2002/0025628 A1 | 2/2002 | Derderian et al. |
| 2002/0027264 A1 | 3/2002 | Forbes et al. |
| 2002/0036939 A1 | 3/2002 | Tsai et al. |
| 2002/0037603 A1 | 3/2002 | Eldridge et al. |
| 2002/0046705 A1 | 4/2002 | Sandhu et al. |
| 2002/0053869 A1 | 5/2002 | Ahn et al. |
| 2002/0074565 A1 | 6/2002 | Flagan et al. |
| 2002/0086507 A1 | 7/2002 | Park et al. |
| 2002/0089023 A1 | 7/2002 | Yu et al. |
| 2002/0100418 A1 | 8/2002 | Sandhu et al. |
| 2002/0102818 A1 | 8/2002 | Sandhu et al. |
| 2002/0106896 A1 | 8/2002 | Kraus et al. |
| 2002/0109158 A1 | 8/2002 | Forbes et al. |
| 2002/0110991 A1 | 8/2002 | Li |
| 2002/0111001 A1 | 8/2002 | Ahn |
| 2002/0115252 A1 | 8/2002 | Haukka et al. |
| 2002/0117704 A1 | 8/2002 | Gonzalez |
| 2002/0122885 A1 | 9/2002 | Ahn |
| 2002/0135048 A1 | 9/2002 | Ahn et al. |
| 2002/0137330 A1 | 9/2002 | Ryan |
| 2002/0142536 A1 | 10/2002 | Zhang et al. |
| 2002/0146916 A1 | 10/2002 | Irino et al. |
| 2002/0155688 A1 | 10/2002 | Ahn |
| 2002/0155689 A1 | 10/2002 | Ahn |
| 2002/0164420 A1 | 11/2002 | Derderian et al. |
| 2002/0167057 A1 | 11/2002 | Ahn et al. |
| 2002/0170671 A1 | 11/2002 | Matsushita et al. |
| 2002/0177244 A1 | 11/2002 | Hsu et al. |
| 2002/0177282 A1 | 11/2002 | Song |
| 2002/0192974 A1 | 12/2002 | Ahn et al. |
| 2002/0192975 A1 | 12/2002 | Ahn |
| 2002/0192979 A1 | 12/2002 | Ahn |
| 2002/0195056 A1 | 12/2002 | Sandhu et al. |
| 2002/0195683 A1 | 12/2002 | Kim et al. |
| 2002/0197881 A1 | 12/2002 | Ramdani et al. |
| 2003/0001190 A1 | 1/2003 | Basceri et al. |
| 2003/0003635 A1 | 1/2003 | Paranjpe et al. |
| 2003/0003722 A1 | 1/2003 | Vaartstra |
| 2003/0003730 A1 | 1/2003 | Li |
| 2003/0016619 A1 | 1/2003 | Judge et al. |
| 2003/0017717 A1 | 1/2003 | Ahn |
| 2003/0027360 A1 | 2/2003 | Hsu et al. |
| 2003/0032270 A1 | 2/2003 | Snyder et al. |
| 2003/0040196 A1 | 2/2003 | Lim et al. |
| 2003/0043637 A1 | 3/2003 | Forbes et al. |
| 2003/0045060 A1 | 3/2003 | Ahn et al. |
| 2003/0045078 A1 | 3/2003 | Ahn et al. |
| 2003/0048666 A1 | 3/2003 | Eldridge et al. |
| 2003/0049942 A1 | 3/2003 | Haukka et al. |
| 2003/0062261 A1 | 4/2003 | Shindo |
| 2003/0092213 A1 | 5/2003 | Yamazaki et al. |
| 2003/0104666 A1 | 6/2003 | Bojarczuk, Jr. et al. |
| 2003/0111678 A1 | 6/2003 | Colombo et al. |
| 2003/0119246 A1 | 6/2003 | Ahn |
| 2003/0119291 A1 | 6/2003 | Ahn et al. |
| 2003/0124783 A1 | 7/2003 | Rotondaro et al. |
| 2003/0132491 A1 | 7/2003 | Ahn |
| 2003/0137019 A1 | 7/2003 | Maria et al. |
| 2003/0139039 A1 | 7/2003 | Ahn et al. |
| 2003/0143801 A1 | 7/2003 | Basceri et al. |
| 2003/0157764 A1 | 8/2003 | Ahn et al. |
| 2003/0162342 A1 | 8/2003 | Chen et al. |
| 2003/0176065 A1 | 9/2003 | Vaartstra |
| 2003/0181060 A1 | 9/2003 | Asai et al. |
| 2003/0200917 A1 | 10/2003 | Vaartstra |
| 2003/0207032 A1 | 11/2003 | Ahn et al. |
| 2003/0207540 A1 | 11/2003 | Ahn et al. |
| 2003/0207593 A1 | 11/2003 | Derderian et al. |
| 2003/0213987 A1 | 11/2003 | Basceri |
| 2003/0227033 A1 | 12/2003 | Ahn et al. |
| 2003/0228747 A1 | 12/2003 | Ahn et al. |
| 2003/0232511 A1 | 12/2003 | Metzner et al. |
| 2003/0234420 A1 | 12/2003 | Forbes |
| 2003/0235066 A1 | 12/2003 | Forbes |
| 2003/0235077 A1 | 12/2003 | Forbes |
| 2003/0235079 A1 | 12/2003 | Forbes |
| 2003/0235081 A1 | 12/2003 | Forbes |
| 2003/0235085 A1 | 12/2003 | Forbes |
| 2003/0235961 A1 | 12/2003 | Metzner et al. |
| 2004/0007171 A1 | 1/2004 | Ritala et al. |
| 2004/0016944 A1 | 1/2004 | Ahn et al. |
| 2004/0023461 A1 | 2/2004 | Ahn et al. |
| 2004/0033681 A1 | 2/2004 | Ahn et al. |
| 2004/0033701 A1 | 2/2004 | Ahn et al. |
| 2004/0036129 A1 | 2/2004 | Forbes et al. |
| 2004/0038554 A1 | 2/2004 | Ahn |
| 2004/0040494 A1 | 3/2004 | Vaartstra et al. |
| 2004/0040501 A1 | 3/2004 | Vaartstra |
| 2004/0041192 A1 | 3/2004 | Baker |
| 2004/0043151 A1 | 3/2004 | Vaartstra |
| 2004/0043541 A1 | 3/2004 | Ahn et al. |
| 2004/0043569 A1 | 3/2004 | Ahn et al. |
| 2004/0043600 A1 | 3/2004 | Vaartstra |
| 2004/0043604 A1 | 3/2004 | Vaartstra |
| 2004/0043625 A1 | 3/2004 | Vaartstra et al. |
| 2004/0043630 A1 | 3/2004 | Vaartstra et al. |
| 2004/0043632 A1 | 3/2004 | Vaartstra |
| 2004/0043633 A1 | 3/2004 | Vaartstra |
| 2004/0043634 A1 | 3/2004 | Vaartstra |
| 2004/0043635 A1 | 3/2004 | Vaartstra |
| 2004/0043636 A1 | 3/2004 | Vaartstra et al. |
| 2004/0061157 A1 | 4/2004 | Kiyotoshi et al. |
| 2004/0063276 A1 | 4/2004 | Yamamoto et al. |
| 2004/0092073 A1 | 5/2004 | Cabral, Jr. et al. |
| 2004/0094801 A1 | 5/2004 | Liang et al. |
| 2004/0110348 A1 | 6/2004 | Ahn et al. |
| 2004/0110391 A1 | 6/2004 | Ahn et al. |
| 2004/0126944 A1 | 7/2004 | Pacheco Rotondaro et al. |
| 2004/0126954 A1 | 7/2004 | Vaartstra et al. |
| 2004/0127003 A1 | 7/2004 | Chambers |
| 2004/0140513 A1 | 7/2004 | Forbes et al. |
| 2004/0142546 A1 | 7/2004 | Kudo et al. |
| 2004/0144980 A1 | 7/2004 | Ahn et al. |
| 2004/0146805 A1 | 7/2004 | Kato et al. |
| 2004/0152254 A1 | 8/2004 | Vaartstra et al. |
| 2004/0156578 A1 | 8/2004 | Geusic et al. |
| 2004/0159863 A1 | 8/2004 | Eldridge et al. |
| 2004/0161883 A1 | 8/2004 | Colombo et al. |
| 2004/0161899 A1 | 8/2004 | Luo et al. |
| 2004/0164357 A1 | 8/2004 | Ahn et al. |

(56) References Cited

U.S. PATENT DOCUMENTS

| | | |
|---|---|---|
| 2004/0164362 A1 | 8/2004 | Conley, Jr. |
| 2004/0164365 A1 | 8/2004 | Ahn et al. |
| 2004/0169453 A1 | 9/2004 | Ahn et al. |
| 2004/0174804 A1 | 9/2004 | Kakiuchi et al. |
| 2004/0175882 A1 | 9/2004 | Ahn et al. |
| 2004/0175910 A1 | 9/2004 | Pan et al. |
| 2004/0178439 A1 | 9/2004 | Ahn et al. |
| 2004/0180171 A1 | 9/2004 | Takasaki et al. |
| 2004/0183108 A1 | 9/2004 | Ahn |
| 2004/0185654 A1 | 9/2004 | Ahn |
| 2004/0187968 A1 | 9/2004 | Vaartstra |
| 2004/0188778 A1 | 9/2004 | Aoyama |
| 2004/0189175 A1 | 9/2004 | Ahn et al. |
| 2004/0191687 A1 | 9/2004 | Fukuzawa et al. |
| 2004/0197946 A1 | 10/2004 | Vaartstra et al. |
| 2004/0198069 A1* | 10/2004 | Metzner et al. ............... 438/785 |
| 2004/0214399 A1 | 10/2004 | Ahn et al. |
| 2004/0217410 A1 | 11/2004 | Meng et al. |
| 2004/0219746 A1 | 11/2004 | Vaartstra et al. |
| 2004/0219783 A1 | 11/2004 | Ahn et al. |
| 2004/0222476 A1 | 11/2004 | Ahn et al. |
| 2004/0233010 A1 | 11/2004 | Akram et al. |
| 2004/0238904 A1 | 12/2004 | Colombo et al. |
| 2004/0248398 A1 | 12/2004 | Ahn et al. |
| 2004/0262700 A1 | 12/2004 | Ahn et al. |
| 2005/0009266 A1 | 1/2005 | Vaartstra |
| 2005/0009335 A1 | 1/2005 | Dean et al. |
| 2005/0009358 A1* | 1/2005 | Choi et al. ................... 438/706 |
| 2005/0009368 A1 | 1/2005 | Vaartstra |
| 2005/0009370 A1 | 1/2005 | Ahn |
| 2005/0019978 A1 | 1/2005 | Vaartstra et al. |
| 2005/0020017 A1 | 1/2005 | Ahn et al. |
| 2005/0023574 A1 | 2/2005 | Forbes et al. |
| 2005/0023584 A1 | 2/2005 | Derderian et al. |
| 2005/0023594 A1 | 2/2005 | Ahn et al. |
| 2005/0023595 A1 | 2/2005 | Forbes et al. |
| 2005/0023602 A1 | 2/2005 | Forbes et al. |
| 2005/0023603 A1 | 2/2005 | Eldridge et al. |
| 2005/0023624 A1 | 2/2005 | Ahn et al. |
| 2005/0023625 A1 | 2/2005 | Ahn et al. |
| 2005/0023626 A1 | 2/2005 | Ahn et al. |
| 2005/0023627 A1 | 2/2005 | Ahn et al. |
| 2005/0024092 A1 | 2/2005 | Forbes |
| 2005/0026349 A1 | 2/2005 | Forbes et al. |
| 2005/0026360 A1 | 2/2005 | Geusic et al. |
| 2005/0026375 A1 | 2/2005 | Forbes |
| 2005/0026458 A1 | 2/2005 | Basceri et al. |
| 2005/0028733 A1 | 2/2005 | Vaartstra |
| 2005/0029547 A1 | 2/2005 | Ahn et al. |
| 2005/0029604 A1 | 2/2005 | Ahn et al. |
| 2005/0029605 A1 | 2/2005 | Ahn et al. |
| 2005/0030825 A1 | 2/2005 | Ahn |
| 2005/0032292 A1 | 2/2005 | Ahn et al. |
| 2005/0032342 A1 | 2/2005 | Forbes et al. |
| 2005/0032360 A1 | 2/2005 | Vaartstra |
| 2005/0034662 A1 | 2/2005 | Ahn |
| 2005/0036370 A1 | 2/2005 | Forbes |
| 2005/0037563 A1 | 2/2005 | Ahn |
| 2005/0042373 A1 | 2/2005 | Kraus et al. |
| 2005/0051854 A1 | 3/2005 | Cabral et al. |
| 2005/0054165 A1 | 3/2005 | Ahn et al. |
| 2005/0059198 A1 | 3/2005 | Visokay et al. |
| 2005/0064636 A1 | 3/2005 | Cabral et al. |
| 2005/0067704 A1* | 3/2005 | Kaneko et al. ................ 257/758 |
| 2005/0070062 A1 | 3/2005 | Visokay et al. |
| 2005/0077519 A1 | 4/2005 | Ahn et al. |
| 2005/0079696 A1 | 4/2005 | Colombo |
| 2005/0082599 A1 | 4/2005 | Forbes |
| 2005/0085040 A1 | 4/2005 | Forbes |
| 2005/0085092 A1 | 4/2005 | Adetutu et al. |
| 2005/0087134 A1 | 4/2005 | Ahn |
| 2005/0106797 A1 | 5/2005 | Colombo |
| 2005/0112499 A1 | 5/2005 | Nakai et al. |
| 2005/0124109 A1 | 6/2005 | Quevado-Lopez et al. |
| 2005/0124171 A1 | 6/2005 | Vaartstra |
| 2005/0124174 A1 | 6/2005 | Ahn et al. |
| 2005/0124175 A1 | 6/2005 | Ahn et al. |
| 2005/0127461 A1 | 6/2005 | Dey et al. |
| 2005/0130442 A1 | 6/2005 | Visokay et al. |
| 2005/0136589 A1 | 6/2005 | Rotondaro et al. |
| 2005/0136632 A1 | 6/2005 | Rotondaro et al. |
| 2005/0136689 A9 | 6/2005 | Vaartstra |
| 2005/0138262 A1* | 6/2005 | Forbes ............................ 711/1 |
| 2005/0140462 A1 | 6/2005 | Akram et al. |
| 2005/0142324 A1 | 6/2005 | Hayashida et al. |
| 2005/0145894 A1 | 7/2005 | Chau et al. |
| 2005/0145957 A1 | 7/2005 | Ahn et al. |
| 2005/0145959 A1 | 7/2005 | Forbes et al. |
| 2005/0151184 A1 | 7/2005 | Lee et al. |
| 2005/0158973 A1 | 7/2005 | Ahn et al. |
| 2005/0160981 A9 | 7/2005 | Vaartstra et al. |
| 2005/0164521 A1 | 7/2005 | Ahn et al. |
| 2005/0170208 A1 | 8/2005 | Yatsunami et al. |
| 2005/0173755 A1 | 8/2005 | Forbes |
| 2005/0179097 A1 | 8/2005 | Forbes et al. |
| 2005/0181607 A1 | 8/2005 | Aoyama |
| 2005/0215015 A1 | 9/2005 | Ahn et al. |
| 2005/0217722 A1 | 10/2005 | Komatsu et al. |
| 2005/0218462 A1 | 10/2005 | Ahn et al. |
| 2005/0221006 A1 | 10/2005 | Vaartstra |
| 2005/0227442 A1 | 10/2005 | Ahn et al. |
| 2005/0242391 A1 | 11/2005 | She et al. |
| 2005/0260347 A1 | 11/2005 | Narwankar et al. |
| 2005/0260357 A1 | 11/2005 | Olsen et al. |
| 2005/0263756 A1 | 12/2005 | Yatsunami et al. |
| 2005/0270963 A1 | 12/2005 | Mishima et al. |
| 2005/0271812 A1 | 12/2005 | Myo et al. |
| 2005/0271813 A1 | 12/2005 | Kher et al. |
| 2005/0272191 A1 | 12/2005 | Shah et al. |
| 2005/0277256 A1 | 12/2005 | Ahn et al. |
| 2005/0280067 A1 | 12/2005 | Ahn et al. |
| 2005/0282329 A1 | 12/2005 | Li |
| 2005/0285208 A1 | 12/2005 | Ren et al. |
| 2005/0285225 A1 | 12/2005 | Ahn et al. |
| 2005/0285226 A1 | 12/2005 | Lee |
| 2005/0287804 A1 | 12/2005 | Vaartstra |
| 2005/0287819 A1 | 12/2005 | Vaartstra et al. |
| 2006/0000412 A1 | 1/2006 | Ahn et al. |
| 2006/0001080 A1 | 1/2006 | Forbes |
| 2006/0001151 A1 | 1/2006 | Ahn et al. |
| 2006/0002188 A1 | 1/2006 | Forbes |
| 2006/0003517 A1 | 1/2006 | Ahn et al. |
| 2006/0003529 A1 | 1/2006 | Baker |
| 2006/0008966 A1 | 1/2006 | Forbes et al. |
| 2006/0019033 A1 | 1/2006 | Muthukrishnan et al. |
| 2006/0023513 A1 | 2/2006 | Forbes et al. |
| 2006/0024975 A1 | 2/2006 | Ahn et al. |
| 2006/0027882 A1 | 2/2006 | Mokhlesi |
| 2006/0028867 A1 | 2/2006 | Forbes et al. |
| 2006/0028869 A1 | 2/2006 | Forbes et al. |
| 2006/0043367 A1 | 3/2006 | Chang et al. |
| 2006/0043463 A1 | 3/2006 | Liu et al. |
| 2006/0043492 A1 | 3/2006 | Ahn et al. |
| 2006/0043504 A1 | 3/2006 | Ahn et al. |
| 2006/0046505 A1 | 3/2006 | Ahn et al. |
| 2006/0046521 A1 | 3/2006 | Vaartstra et al. |
| 2006/0046522 A1 | 3/2006 | Ahn et al. |
| 2006/0048711 A1 | 3/2006 | Vaartstra |
| 2006/0062917 A1 | 3/2006 | Muthukrishnan et al. |
| 2006/0084247 A1 | 4/2006 | Liu |
| 2006/0086993 A1 | 4/2006 | Suzuki et al. |
| 2006/0110870 A1 | 5/2006 | Bhattacharyya |
| 2006/0113603 A1 | 6/2006 | Currie |
| 2006/0113605 A1 | 6/2006 | Currie |
| 2006/0121744 A1 | 6/2006 | Quevedo-Lopez et al. |
| 2006/0125030 A1 | 6/2006 | Ahn et al. |
| 2006/0128168 A1 | 6/2006 | Ahn et al. |
| 2006/0134870 A1 | 6/2006 | Luan et al. |
| 2006/0148180 A1 | 7/2006 | Ahn et al. |
| 2006/0166476 A1 | 7/2006 | Lee et al. |
| 2006/0172485 A1 | 8/2006 | Vaartstra |
| 2006/0176645 A1 | 8/2006 | Ahn et al. |
| 2006/0177975 A1 | 8/2006 | Ahn et al. |
| 2006/0183272 A1 | 8/2006 | Ahn et al. |

(56) References Cited

U.S. PATENT DOCUMENTS

| | | |
|---|---|---|
| 2006/0186458 A1 | 8/2006 | Forbes et al. |
| 2006/0189154 A1 | 8/2006 | Ahn et al. |
| 2006/0205132 A1 | 9/2006 | Bhattacharyya |
| 2006/0223248 A1 | 10/2006 | Venugopal et al. |
| 2006/0223337 A1 | 10/2006 | Ahn et al. |
| 2006/0228868 A1 | 10/2006 | Ahn et al. |
| 2006/0231017 A1 | 10/2006 | Vaartstra |
| 2006/0237764 A1 | 10/2006 | Ahn et al. |
| 2006/0237796 A1 | 10/2006 | Cartier et al. |
| 2006/0240626 A1 | 10/2006 | Forbes |
| 2006/0244045 A1 | 11/2006 | Visokay et al. |
| 2006/0244082 A1 | 11/2006 | Ahn et al. |
| 2006/0244100 A1 | 11/2006 | Ahn et al. |
| 2006/0245339 A1 | 11/2006 | Fukuzawa et al. |
| 2006/0246647 A1 | 11/2006 | Visokay et al. |
| 2006/0246651 A1 | 11/2006 | Chambers et al. |
| 2006/0246741 A1 | 11/2006 | Ahn et al. |
| 2006/0252211 A1 | 11/2006 | Ahn et al. |
| 2006/0252244 A1 | 11/2006 | Vaartstra et al. |
| 2006/0252279 A1 | 11/2006 | Vaartstra |
| 2006/0255470 A1 | 11/2006 | Ahn et al. |
| 2006/0258097 A1 | 11/2006 | Forbes et al. |
| 2006/0258175 A1 | 11/2006 | Vaartstra et al. |
| 2006/0261376 A1 | 11/2006 | Forbes et al. |
| 2006/0261389 A1 | 11/2006 | Vaartstra |
| 2006/0261397 A1 | 11/2006 | Ahn et al. |
| 2006/0263972 A1 | 11/2006 | Ahn et al. |
| 2006/0264064 A1 | 11/2006 | Ahn et al. |
| 2006/0264066 A1 | 11/2006 | Bartholomew et al. |
| 2006/0270147 A1 | 11/2006 | Ahn et al. |
| 2006/0278940 A1 | 12/2006 | Kato et al. |
| 2006/0281330 A1 | 12/2006 | Ahn et al. |
| 2006/0284220 A1 | 12/2006 | Watanabe et al. |
| 2006/0292773 A1 | 12/2006 | Goolsby et al. |
| 2006/0292788 A1 | 12/2006 | Vaartstra |
| 2007/0006798 A1 | 1/2007 | Vaartstra et al. |
| 2007/0007560 A1 | 1/2007 | Forbes et al. |
| 2007/0007635 A1 | 1/2007 | Forbes et al. |
| 2007/0010060 A1 | 1/2007 | Forbes et al. |
| 2007/0015331 A1 | 1/2007 | Forbes |
| 2007/0018214 A1 | 1/2007 | Ahn |
| 2007/0027882 A1 | 2/2007 | Kulkarni |
| 2007/0037335 A1 | 2/2007 | Chambers et al. |
| 2007/0037415 A1 | 2/2007 | Ahn et al. |
| 2007/0045676 A1 | 3/2007 | Forbes et al. |
| 2007/0045752 A1 | 3/2007 | Forbes et al. |
| 2007/0048926 A1 | 3/2007 | Ahn |
| 2007/0049023 A1 | 3/2007 | Ahn et al. |
| 2007/0049051 A1 | 3/2007 | Ahn et al. |
| 2007/0049054 A1 | 3/2007 | Ahn et al. |
| 2007/0059881 A1 | 3/2007 | Ahn et al. |
| 2007/0069241 A1 | 3/2007 | Yang et al. |
| 2007/0087563 A1 | 4/2007 | Ahn et al. |
| 2007/0090439 A1 | 4/2007 | Ahn et al. |
| 2007/0090440 A1 | 4/2007 | Ahn et al. |
| 2007/0090441 A1 | 4/2007 | Ahn et al. |
| 2007/0092989 A1 | 4/2007 | Kraus et al. |
| 2007/0099366 A1 | 5/2007 | Ahn et al. |
| 2007/0101929 A1 | 5/2007 | Ahn et al. |
| 2007/0107661 A1 | 5/2007 | Ahn |
| 2007/0111544 A1 | 5/2007 | Ahn |
| 2007/0141797 A1 | 6/2007 | Li |
| 2007/0144438 A1 | 6/2007 | Vaartstra |
| 2007/0145454 A1 | 6/2007 | Bhattacharyya |
| 2007/0155190 A1 | 7/2007 | Vaartstra et al. |
| 2007/0158765 A1 | 7/2007 | Ahn et al. |
| 2007/0161260 A1 | 7/2007 | Vaartstra |
| 2007/0164323 A1 | 7/2007 | Forbes et al. |
| 2007/0164367 A1 | 7/2007 | Forbes et al. |
| 2007/0166999 A1 | 7/2007 | Vaartstra |
| 2007/0181931 A1 | 8/2007 | Ahn et al. |
| 2007/0234949 A1 | 10/2007 | Ahn et al. |
| 2007/0295273 A1 | 12/2007 | Vaartstra |
| 2008/0029790 A1 | 2/2008 | Ahn et al. |
| 2008/0032424 A1 | 2/2008 | Ahn et al. |
| 2008/0054330 A1 | 3/2008 | Forbes et al. |
| 2008/0057659 A1 | 3/2008 | Forbes |
| 2008/0057690 A1 | 3/2008 | Forbes |
| 2008/0064210 A1 | 3/2008 | Vaartstra |
| 2008/0087945 A1 | 4/2008 | Forbes et al. |
| 2008/0102629 A1 | 5/2008 | Vaartstra |
| 2008/0121962 A1 | 5/2008 | Forbes et al. |
| 2008/0124907 A1 | 5/2008 | Forbes et al. |
| 2008/0124908 A1 | 5/2008 | Forbes et al. |
| 2009/0236650 A1 | 9/2009 | Forbes et al. |
| 2012/0205720 A1 | 8/2012 | Forbes et al. |

FOREIGN PATENT DOCUMENTS

| | | |
|---|---|---|
| GB | 2353404 | 2/2001 |
| JP | 62-199019 | 9/1987 |
| JP | 3222367 A | 10/1991 |
| JP | 5090169 | 4/1993 |
| JP | 6224431 A | 8/1994 |
| JP | 6302828 A | 10/1994 |
| JP | 8255878 A | 10/1996 |
| JP | 2001-332546 | 11/2001 |
| WO | WO-9907000 A2 | 2/1999 |
| WO | WO-9917371 A1 | 4/1999 |
| WO | WO-0197257 A2 | 12/2001 |
| WO | WO-0231875 A2 | 4/2002 |
| WO | WO-2004019394 A1 | 3/2004 |

OTHER PUBLICATIONS

"International Technology Roadmap for Semiconductors, 2001 Edition", Organized by International SEMATECH, [Online]. Retrieved from the Internet: <URL: http://public.itrs.net/Files/2001ITRS/Home.html>, (2001), 469 pages.

Aarik, J., et al., "Atomic layer growth of epitaxial TiO/sub 2/ thin films from TiCl/sub 4/ and H/sub 2/O on alpha -Al/sub 2/O/sub 3/ substrates", Journal of Crystal Growth, 242(1-2), (2002), 189-198.

Aarik, J., et al., "Phase transformations in hafnium dioxide thin films grown by atomic layer deposition at high temperatures", Applied Surface Science, 173(1-2), (Mar. 2001), 15-21.

Aarik, Jaan, "Influence of substrate temperature on atomic layer growth and properties of HfO/sub 2/ thin films", Thin Solid Films, 340(1-2), (1999), 110-116.

Aarik, Jaan, et al., "Texture development in nanocrystalline hafnium dioxide thin films grown by atomic layer deposition", Journal of Crystal Growth, 220(1-2), (Nov. 15, 2000), 105-113.

Bright, A A, et al., "Low-rate plasma oxidation of Si in a dilute oxygen/helium plasma for low-temperature gate quality Si/Sio2 interfaces", Applied Physics Letters, 58(6), (Feb. 1991), 619-621.

Callegari, A., et al., "Physical and electrical characterization of Hafnium oxide and Hafnium silicate sputtered films", Journal of Applied Physics, 90(12), (Dec. 15, 2001), 6466-75.

Cartier, E., et al., "Systematic study of pFET Vt with Hf-based gate stacks with poly-Si and FUSI gates", 2004 Symposium on VLSI Technology Digest of Technical Papers, (2004), 44-45.

Chen, F., "A study of mixtures of HfO2 and TiO2 as high-k gate dielectrics", Microelectronic Engineering 72, (2004), 263.

Cheng, Baohong, et al., "The Impact of High-k Gate Dielectrics and Metal Gate Electrodes on Sub-100nm MOSFET's", IEEE Transactions on Electron Devices, 46(7), (Jul. 1999), 1537-1544.

Choi, Rino, et al., "High-Quality Ultra-thin HfO2 Gate Dielectric MOSFETs with TaN Electrode and Nitridation Surface Properties", 2001 Symposium on VLSI Technology Digest of Technical Papers, (2001), 15-16.

Clark, P, "IMEC Highlights Hafnium, Metal Gates for High-k Integration", Semiconductor Business News, at Silicon Strategies.com, (Oct. 11, 2002), 2 pages.

Colombo, D., et al., "Anhydrous Metal Nitrates as Volatile Single Source Precursors for the CVD of Metal Oxide Films", Communications, Department of EE, U of M, Mpls, MN, (Jul. 7, 1998), 3 pages.

Conley, J. F, "Atomic Layer Deposition of Hafnium Oxide Using Anhydrous Hafnium Nitrate", Electrochemical and Solid-State Letters, 5(5), (May 2002), C57-059.

(56) References Cited

OTHER PUBLICATIONS

Desu, S B, "Minimization of Fatigue in Ferroelectric Films", Physica Status Solidi A, 151(2), (1995), 467-480.
Engelhardt, M., "Modern Applications of Plasma Etching and Patterning in Silicon Process Technology", Contributions to Plasma Physics, 39(5), (1999), 473-478.
Fang, Q., et al., "Investigation of TiO2-dp[ed HfO2 thin films deposited by photo-CVD", Thin Solid Films 428, (2003), 263-268.
Forsgren, Katarina, "Atomic Layer Deposition of HfO2 using hafnium iodide", Conference held in Monterey, California, (May 2001), 1 page.
Fuyuki, Takashi, et al., "Electronic Properties of the Interface between Si and TiO2 Deposited at Very Low Temperatures", Japanese Journal of Applied Physics, Part 1 (Regular Papers & Short Notes), 25(9), (Sep. 1986), 1288-1291.
Fuyuki, Takashi, et al., "Initial stage of ultra-thin SiO/sub 2/ formation at low temperatures using activated oxygen", Applied Surface Science, 117-118, (Jun. 1997), 123-126.
Gartner, M, "Spectroellipsometric characterization of lanthanide-doped TiO2 films obtained via the sol-gel technique", Thin Solid Films, 234(1-2), (1993), 561-565.
Geller, S., et al., "Crystallographic Studies of Perovskite-like Compounds. II. Rare Earth Aluminates", Acta Cryst., 9, (May 1956), 1019-1025.
Giess, E. A., et al., "Lanthanide gallate perovskite-type substrates for epitaxial, high-T/sub c/ superconducting Ba/sub 2/YCu/sub 3/O/sub 7- delta / films", IBM Journal of Research and Development, 34(6), (Nov. 1990), 916-926.
Guillaumot, B, et al., "75 nm damascene metal gate and high-k integration for advanced CMOS devices", Technical Digest of International Electron Devices Meeting 2002, (2002), 355-358.
Gusev, E P, "Ultrathin High-K Dielectrics Grown by Atomic Layer Deposition: A Comparative Study of ZrO2, HfO2, Y2O3 and Al2O3", Electrochemical Society Proceedings vol. 2001-9, (2001), 189-195.
Gutowski, M J, "Thermodynamic stability of high-K dielectric metal oxides ZrO/sub 2/ and HfO/sub 2/ in contact with Si and SiO/sub 2/", Applied Physics Letters, 80(11), (Mar. 18, 2002), 1897-1899.
Hirayama, Masaki, et al., "Low-Temperature Growth of High-Integrity Silicon Oxide Films by Oxygen Radical Generated in High Density Krypton Plasma", International Electron Devices Meeting 1999. Technical Digest, (1999), 249-252.
Hobbs, C., et al., "Fermi Level Pinning at the PolySi/Metal Oxide Interface", 2003 Symposium on VLSI Technology Digest of Technical Papers, (2003), 9-10.
Hubbard, K. J., et al., "Thermodynamic stability of binary oxides in contact with silicon", Journal of Materials Research, 11(11), (Nov. 1996), 2757-2776.
Hunt, C. E., et al., "Direct bonding of micromachined silicon wafers for laser diode heat exchanger applications", Journal of Micromechanics and Microengineering, 1(3), (Sep. 1991), 152-156.
Inumiya, Seiji, et al., "Fabrication of HfSiON gate dielectrics by plasma oxidation and nitridation, optimized for 65 nm mode low power CMOS applications", 2003 Symposium on VLSI Technology Digest of Technical Papers, (Jun. 10-12, 2003), 17-18.
Jeong, Chang-Wook, et al., "Plasma-Assisted Atomic layer Growth of High-Quality Aluminum Oxide Thin Films", Japanese Journal of Applied Physics, 40, (Jan. 2001), 285-289.
Kawai, Y, et al., "Ultra-low-temperature growth of high-integrity gate oxide films by low-energy Ion-assisted oxidation", Applied Physics Letters, 64(17), (Apr. 1994), 2223-2225.
Kedzierski, Jakub, et al., "Threshold voltage control in NiSi-gated MOSFETs through silicidation induced impurity segregation (SIIS)", IEDM Tech. Dig., (2003), 315-318.
Keomany, D, et al., "Sol gel preparation of mixed cerium-titanium oxide thin films", Solar Energy Materials and Solar Cells, 33(4), (Aug. 1994), 429-441.
Kim, Byoung-Youp, et al., "Comparison study for TiN films deposited from different method: chemical vapor deposition and atomic layer deposition", Mechanisms of Surface and Microstructure Evolution in Deposited Films and Film Structures Symposium (Materials Research Society Symposium Proceedings vol. 672), (2001), 7.8.1-7.8.6.
Kim, C. T., "Application of Al2O3 Grown by Atomic Layer Deposition to DRAM and FeRAM", 12th International Symposium in Integrated Ferroelectrics, (Mar. 2000), p. 316.
Kim, D., et al., "Atomic Control of Substrate Termination and Heteroepitaxial Growth of SrTiO3/LaAlO3 Films", Journal of the Korean Physical Society, 36(6), (Jun. 2000), 444-448.
Kim, Y., et al., "Substrate dependence on the optical properties of Al/sub 2/O/sub 3/ films grown by atomic layer deposition", Applied Physics Letters, 71(25 ), (Dec. 22, 1997), 3604-3606.
Krauter, G., et al., "Room Temperature Silicon Wafer Bonding with Ultra-Thin Polymer Films", Advanced Materials, 9(5), (1997), 417-420.
Kukli, K J, et al., "Properties of hafnium oxide films grown by atomic layer deposition from hafnium tetraiodide and oxygen", Journal of Applied Physics, 92(10), (Nov. 15, 2002), 5698-5703.
Kukli, K., et al., "Controlled growth of yttrium oxysulphide thin films by atomic layer deposition", Materials Science Forum, 315-317, (1999), 216-221.
Kukli, Kaupo, "Atomic Layer Deposition of Titanium Oxide from TiI4 and H2O2", Chemical Vapor Deposition, 6(6), (2000), 303-310.
Kukli, Kaupo, "Atomic Layer Epitaxy Growth of Tantalum Oxide Thin Films from Ta(OC2H5)5 and H2O", J. Electrochem. Soc., vol. 142, No. 5, (May 1995), 1670-1675.
Kukli, Kaupo, "Comparison of hafnium oxide films grown by atomic layer deposition from iodide and chloride precursors", Thin Solid Films, 416, (2002), 72-79.
Kukli, Kaupo, "Tailoring the dielectric properties of HfO2-Ta2O3 nanolaminates", Appl. Phys. Lett., 68, (1996), 3737-3739.
Kwon, J., et al., "Two-step Atomic Layer Deposition for Tantalum Nitride by Nitridation of Tantalum with Ammonia", J208th ECS Meeting—Los Angeles, CA, Oct. 16-21, 2005, (2005).
Lee, A E, et al., "Epitaxially grown sputtered LaAlO3 films", Applied Physics Letters, 57(19), (Nov. 1990), 2019-2021.
Lee, Byoung Hun, et al., "Ultrathin Hafnium Oxide with Low Leakage and Excellent Reliability for Alternative Gate Dielectric Application", Technical Digest of IEDM, (1999), 133-136.
Lee, Cheng-Chung, et al., "Ion-assisted deposition of silver thin films", Thin Solid Films, 359(1), (Jan. 2000), 95-97.
Lee, Dong Heon, et al., "Metalorganic chemical vapor deposition of TiO/sub 2/:N anatase thin film on Si substrate", Applied Physics Letters, 66(7), (Feb. 1995), 815-816.
Lee, Jaehoon, et al., "Compatibility of Dual Metal Gate Electrodes with High-K Dielectrics for CMOS", IEDM Tech. Dig., (2003), 323-326.
Lee, L P, et al., "Monolithic 77 K dc SQUID magnetometer", Applied Physics Letters, 59(23), (Dec. 1991), 3051-3053.
Lee, S. J., et al., "Hafnium oxide gate stack prepared by in situ rapid thermal chemical vapor deposition process for advanced gate dielectrics", Journal of Applied Physics, 92 (5), (Sep. 1, 2002), 2807-09.
Lee, S. J., et al., "Performance and Reliability of Ultra Thin CVD HfO2 Gate Dielectrics with Dual Poly-Si Gate Electrodes", 2001 Symposium on VLSI Technology, (2001), 133-134.
Leskela, M, "ALD precursor chemistry: Evolution and future challenges", Journal de Physique IV (Proceedings), 9(8), (Sep. 1999), 837-852.
Liu, C. T., "Circuit Requirement and Integration Challenges of Thin Gate Dielectrics for Ultra Small MOSFETs", International Electron Devices Meeting 1998. Technical Digest, (1998), 747-750.
Liu, Y C, et al., "Growth of ultrathin SiO/sub 2/ on Si by surface irradiation with an O/sub 2/+Ar electron cyclotron resonance microwave plasma at low temperatures", Journal of Applied Physics, 85(3), (Feb. 1999), 1911-1915.
Lu, N., et al., "Electrical Properties of Amorphous High-k HfTaTiO Gate Dielectric With Dielectric Constants of 40-60", IEEE Electron Device Letters, vol. 26, No. 5, (May 2005), 298-300.
Lucovsky, G, et al., "Microscopic model for enhanced dielectric constants in low concentration SiO/sub 2/-rich noncrystalline Zr and Hf silicate alloys", Applied Physics Letters, 77(18), (Oct. 2000), 2912-2914.

(56) References Cited

OTHER PUBLICATIONS

Martin, P J, et al., "Ion-beam-assisted deposition of thin films", Applied Optics, 22(1), (Jan. 1983), 178-184.

Molodyk, A A, et al., "Volatile Surfactant-Assisted MOCVD: Application to LaAlO3 Thin Film Growth", Chemical Vapor Deposition, 6(3), (Jun. 2000), 133-138.

Molsa, Heinz, et al., "Growth of yttrium oxide thin films from beta-diketonate precursor", Advanced Materials for Optics and Electronics, 4(6), (Nov.-Dec. 1994), 389-400.

Morioka, Ayuka, et al., "High Mobility MISFET with Low Trapped Charge in HfSiO Films", 2003 Symposium on VLSI Technology Digest of Technical Papers, (2003), 165-166.

Muller, D. A., et al., "The Electronic Structure at the Atomic Scale of Ultrathin Gate Oxides", Nature, 399, (Jun. 1999), 758-761.

Nakajima, Anri, et al., "NH/sub 3/-annealed atomic-layer-deposited silicon nitride as a high-k gate dielectric with high reliability", Applied Physics Letters, 80(7), (Feb. 2002), 1252-1254.

Nakajima, Anri, "Soft breakdown free atomic-layer-deposited silicon-nitride/SiO/sub 2/ stack gate dielectrics", International Electron Devices Meeting. Technical Digest, (2001), 6.5.1-4.

Nalwa, H. S, "Handbook of Thin Film Materials", Deposition and Processing of Thin Films, vol. 1, San Diego : Academic Press, (2002), 114-119.

Narayanan, V., et al., "Dual Work Function Metal Gate CMOS using CVD metal electrodes", 2004 Symposium on VLSI Technology Digest of Technical Papers, (2004), 192-193.

Neumayer, D A, et al., "Materials characterization of ZrO/sub 2/-SiO/sub 2/ and HfO/sub 2/-SiO/sub 2/ binary oxides deposited by chemical solution deposition", Journal of Applied Physics, 90(4), (Aug. 15, 2001), 1801-1808.

Nieminen, Minna, et al., "Formation and stability of lanthanum oxide thin films deposited from B-diketonate precursor", Applied Surface Science, 174(2), (Apr. 16, 2001), 155-165.

Ohring, Milton, "The Materials Science of Thin Films", Boston : Academic Press, (1992), 118,121,125.

Osten, H J, et al., "High-k Gate Dielectrics with Ultra-low Leakage Current Based on Praseodymium Oxide", Technical Digest of IEDM, (2000), 653-656.

Pan, Tung Ming, et al., "High quality ultrathin CoTiO/sub 3/ high-k gate dielectrics", Electrochemical and Solid-State Letters, 3(9), (Sep. 2000), 433-434.

Pan, Tung Ming, et al., "High-k cobalt-titanium oxide dielectrics formed by oxidation of sputtered Co/Ti or Ti/Co films", Applied Physics Letters, 78(10), (Mar. 5, 2001), 1439-1441.

Park, Byoung K., et al., "Interfacial reaction between chemically vapor-deposited HfO2 thin films and a HF-cleaned Si substrate during film growth and postannealing", Applied Physics Letters, 80(13), (Apr. 1, 2002), 2368-70.

Park, Byung-Eun, et al., "Electrical properties of LaAlO3/Si and Sr0.8Bi2.2Ta2O9/LaAlO3/Si structures", Applied Physics Letters, 79(6), (Aug. 2001), 806-808.

Park, D.-G., et al., "Thermally robust dual-work function ALD-MNx MOSFETs using conventional CMOS process flow", 2004 Symposium on VLSI Technology Digest of Technical Papers, (2004), 186-187.

Qi, Wen-Me, et al., "MOSCAP and MOSFET characteristics using ZrO2 gate dielectric deposited directly on Si", Electron Devices Meeting, 1999. IEDM Technical Digest. International, (1999), 145-148.

Rayner Jr., G, et al., "The structure of plasma-deposited and annealed pseudo-binary ZrO2-SiO2 alloys", Materials Research Society Symposium—Proceedings, 611, (2000), C131-C139.

Ritala, Mikko, "Atomic Layer Epitaxy Growth of Titanium, Zirconium and Hafnium Dioxide Thin Films", Annales Academiae Scientiarum Fennicae, (1994), 24-25.

Rossnagel, S. M., et al., "Plasma-enhanced atomic layer deposition of Ta and Ti for Interconnect diffusion barriers", Journal of Vacuum Science & Technology B (Microelectronics and Nanometer Structures), 18(4), (Jul. 2000), 2016-2020.

Rotondaro, A L, et al., "Advanced CMOS Transistors with a Novel HfSiON Gate Dielectric", Symposium on VLSI Technology Digest of Technical Papers, (2002), 148-149.

Saito, Yuji, et al., "Advantage of Radical Oxidation for Improving Reliability of Ultra-Thin Gate Oxide", 2000 Symposium on VLSI Technology Digest of Technical Papers, (2000), 176-177.

Saito, Yuji, et al., "High-Integrity Silicon Oxide Grown at Low-Temperature by Atomic Oxygen Generated in High-Density Krypton Plasma", Extended Abstracts of the 1999 International Conference on Solid State Devices and Materials, (1999), 152-153.

Samavedam, S. B., "Dual-Metal Gate CMOS with HfO2 Gate Dielectric", IEDM Tech. Dig., (2002), 433-436.

Schaeffer, J. K., et al., "Physical and electrical properties of metal gate elecrodes on HfO2 gate dielectrics", J. Vac. Sci. Technol. B 21(1), (2003), 11-17.

Shanware, A., et al., "Characterization and comparison of the charge trapping in HfSiON and HfO/sub 2/ gate dielectrics", IEEE International Electron Devices Meeting, 2003. IEDM '03 Technical Digest., (Dec. 8-10, 2003), 38.6.1-38.6.4.

Shin, Chang Ho, et al., "Fabrication and Characterization of MFISFET using Al2O3 Insulating Layer for Non-Volatile Memory", 12th International Symposium in Integrated Ferroelectrics, (Mar. 2000), 1-9.

Smith, Ryan C., "Chemical Vapour Deposition of the Oxides of Titanium, Zirconium and Hafnium for Use as High-k Materials in Microelectronic Devices. A Carbon-free Precursor for the Synthesis of Hafnium Dioxide", Advanced Materials for Optics and Electronics, 10(3-5), (2000), 105-114.

Song, Hyun-Jung, et al., "Atomic Layer Deposition of Ta2O5 Films Using Ta(OC2H5)5 and NH3", Ultrathin SiO/sub 2/ and High-K Materials for ULSI Gate Dielectrics. Symposium, (1999), 469-471.

Stanley, Wolf, "Silicon processing for the VLSI area", vol. 1 process technology 2nd edition<lattice press, (Jun. 2000), 448.

Suntola, T., "Atomic Layer Epitaxy", Handbook of Crystal Growth, 3; Thin Films of Epitaxy, Part B: Growth Mechanics and Dynamics, Amsterdam, (1994), 601-663.

Suntola, Tuomo, "Atomic layer epitaxy", Thin Solid Films, 216(1), (Aug. 28, 1992), 84-89.

Sze, S M, "Physics of Semiconductor Devices", New York : Wiley, (1981), 431.

Sze, S M, "Physics of Semiconductor Devices", New York : Wiley, (1981), 473.

Takahashi, Kensuke, et al., "High-Mobility Dual Metal Gate MOS Transistors with High-K Gate Dielectrics", Japanese Journal of Applied Physics, vol. 44, No. 4B, (2005), 2210-2213.

Takemoto, J. H., et al., "Microstrip Resonators and Filters Using High-TC Superconducting Thin Films on LaAlO3", IEEE Transaction on Magnetics, 27(2), (Mar. 1991), 2549-2552.

Tsai, W., et al., "Performance comparison of sub 1 nm sputtered TiN/HfO2 nMOS and pMOSFETs", IEDM Tech. Dig., (2003), 311-314.

Van Dover, R B, "Amorphous lanthanide-doped TiOx dielectric films", Applied Physics Letters, 74(20), (May 1999), 3041-3043.

Viirola, H, et al., "Controlled growth of antimony-doped tin dioxide thin films by atomic layer epitaxy", Thin Solid Films, 251, (Nov. 1994), 127-135.

Viirola, H, et al., "Controlled growth of tin dioxide thin films by atomic layer epitaxy", Thin Solid Films, 249(2), (Sep. 1994), 144-149.

Visokay, M R, "Application of HfSiON as a gate dielectric material", Applied Physics Letters, 80(17), (Apr. 2002), 3183-3185.

Wilk, G D, et al., "Hafnium and zirconium silicates for advanced gate dielectrics", Journal of Applied Physics, 87(1), (Jan. 2000), 484-492.

Wilk, G. D., "High-K gate dielectrics: Current status and materials properties considerations", Journal of Applied Physics, 89(10), (May 2001), 5243-5275.

Wolf, S., et al., Silicon Processing for the VLSI Era—vol. 4: Deep-Submicron Process Technology, Lattice Press, Sunset Beach, CA, (2002), p. 98, 146 173-174.

Yamamoto, K., "Effect of Hf metal predeposition on the properties of sputtered HfO2/Hf stacked gate dielectrics", Applied Physics Letters, 81, (Sep. 9, 2002), 2053-2055.

(56) References Cited

OTHER PUBLICATIONS

Yu, Xiongfei, et al., "High Mobility and Excellent Electrical Stability of MOSFETs Using a Novel HfTaO Gate Dielectric", 2004 Symposium on VLSI Technology Digest of Technical Papers, (Jun. 15-17, 2004), 110-111.

Zhang, H, et al., "High permitivity thin film nanolaminates", Journal of Applied Physics, 87(4), (Feb. 2000), 1921-1924.

Zucker, O, et al., "Application of Oxygen Plasma Processing to Silicon Direct Bonding", Sensors and Actuators A, 36, (1993), 227-231.

International Technology Roadmap for Semiconductors—2003, (2003), 1-665.

"U.S. Appl. No. 10/191,336, Final Office Action mailed Mar. 21, 2005", 7 pgs.

"U.S. Appl. No. 10/191,336, Final Office Action mailed May 23, 2006", 7 pgs.

"U.S. Appl. No. 10/191,336, Final Office Action mailed Jun. 8, 2005", 6 pgs.

"U.S. Appl. No. 10/191,336, Non Final Office Action mailed Mar. 3, 2004", 8 pgs.

"U.S. Appl. No. 10/191,336, Non Final Office Action mailed Aug. 20, 2004", 7 pgs.

"U.S. Appl. No. 10/191,336, Non Final Office Action mailed Nov. 2, 2005", 9 pgs.

"U.S. Appl. No. 10/191,336, Notice of Allowance mailed Nov. 14, 2006", 2 pgs.

"U.S. Appl. No. 10/191,336, Response filed Feb. 2, 2006 to Non Final Office Action mailed Nov. 2, 2005", 19 pgs.

"U.S. Appl. No. 10/191,336, Response filed Apr. 18, 2005 to Final Office Action mailed Mar. 21, 2005", 18 pgs.

"U.S. Appl. No. 10/191,336, Response filed Jun. 3, 2004 to Non Final Office Action mailed Mar. 3, 2004", 19 pgs.

"U.S. Appl. No. 10/191,336, Response filed Aug. 8, 2005 to Final Office Action mailed Jun. 8, 2005", 21 pgs.

"U.S. Appl. No. 10/191,336, Response filed Aug. 23, 2006 to Final Office Action mailed May 23, 2006", 10 pgs.

"U.S. Appl. No. 10/191,336, Response filed Nov. 10, 2004 to Non Final Office Action mailed Aug. 20, 2004", 19 pgs.

"U.S. Appl. No. 10/191,336, Response filed Nov. 20, 2003 to Non Final Office Action mailed Aug. 20, 2003", 41 pgs.

"U.S. Appl. No. 10/225,605, Advisory Action mailed Apr. 27, 2005", 3 pgs.

"U.S. Appl. No. 10/225,605, Advisory Action mailed May 8, 2007", 3 pgs.

"U.S. Appl. No. 10/225,605, Advisory Action mailed May 30, 2007", 3 pgs.

"U.S. Appl. No. 10/225,605, Advisory Action mailed Jun. 11, 2007", 3 pgs.

"U.S. Appl. No. 10/225,605, Final Office Action mailed Feb. 9, 2005", 18 pgs.

"U.S. Appl. No. 10/225,605, Final Office Action mailed Feb. 27, 2007", 25 pgs.

"U.S. Appl. No. 10/225,605, Final Office Action mailed Mar. 14, 2006", 22 pgs.

"U.S. Appl. No. 10/225,605, Non Final Office Action mailed Apr. 7, 2004", 19 pgs.

"U.S. Appl. No. 10/225,605, Non Final Office Action mailed Aug. 8, 2005", 19 pgs.

"U.S. Appl. No. 10/225,605, Non Final Office Action mailed Sep. 26, 2006", 19 pgs.

"U.S. Appl. No. 10/225,605, Non Final Office Action mailed Oct. 6, 2003", 18 pgs.

"U.S. Appl. No. 10/225,605, Non Final Office Action mailed Oct. 14, 2004", 24 pgs.

"U.S. Appl. No. 10/225,605, Response filed Jan. 6, 2004 to Non Final Office Action mailed Oct. 6, 2003", 16 pgs.

"U.S. Appl. No. 10/225,605, Response filed Apr. 13, 2005 to Final Office Action mailed Feb. 9, 2005", 17 pgs.

"U.S. Appl. No. 10/225,605, Response filed Apr. 24, 2007 to Final Office Action mailed Feb. 27, 2007", 22 pgs.

"U.S. Appl. No. 10/225,605, Response filed May 9, 2005 to Advisory Action mailed Apr. 27, 2005", 17 pgs.

"U.S. Appl. No. 10/225,605, Response filed May 24, 2007 to Advisory Action mailed May 8, 2007", 22 pgs.

"U.S. Appl. No. 10/225,605, Response filed Jul. 7, 2004 to Non Final Office Action mailed Apr. 7, 2004", 15 pgs.

"U.S. Appl. No. 10/225,605, Response filed Jul. 14, 2006 to Advisory Action mailed May 30, 2006", 16 pgs.

"U.S. Appl. No. 10/225,605, Response filed Nov. 30, 2004 to Non Final Office Action mailed Oct. 14, 2004", 16 pgs.

"U.S. Appl. No. 10/225,605, Response filed Dec. 22, 2006 to Non-Final Office Action mailed Sep. 26, 2006", 22 pgs.

"U.S. Appl. No. 10/225,605, Restriction Requirement mailed Jun. 11, 2003", 4 pgs.

"U.S. Appl. No. 10/229,903, 312 Amendment filed Oct. 31, 2006", 3 pgs.

"U.S. Appl. No. 10/229,903, Advisory Action mailed May 24, 2006", 3 pgs.

"U.S. Appl. No. 10/229,903, Final Office Action mailed Mar. 8, 2006", 16 pgs.

"U.S. Appl. No. 10/229,903, Final Office Action mailed Mar. 25, 2004", 11 pgs.

"U.S. Appl. No. 10/229,903, Non Final Office Action mailed Oct. 27, 2005", 12 pgs.

"U.S. Appl. No. 10/229,903, Non Final Office Action mailed Oct. 30, 2003", 7 pgs.

"U.S. Appl. No. 10/229,903, Notice of Allowance mailed Jan. 26, 2005", 3 pgs.

"U.S. Appl. No. 10/229,903, Notice of Allowance mailed Jun. 21, 2004", 4 pgs.

"U.S. Appl. No. 10/229,903, Notice of Allowance mailed Aug. 1, 2006", 5 pgs.

"U.S. Appl. No. 10/229,903, Response filed Jan. 27, 2006 to Non Final Office Action mailed Oct. 27, 2006", 24 pgs.

"U.S. Appl. No. 10/229,903, Response filed Jan. 30, 2004 to Non Final Office Action mailed Oct. 30, 2003", 15 pgs.

"U.S. Appl. No. 10/229,903, Response filed May 8, 2006 to Final Office Action mailed Mar. 8, 2006", 23 pgs.

"U.S. Appl. No. 10/229,903, Response filed May 19, 2004 to Final Office Action mailed Mar. 25, 2004", 24 pgs.

"U.S. Appl. No. 10/229,903, Response filed Jun. 8, 2006 to Advisory Action mailed May 24, 2006", 2 pgs.

"U.S. Appl. No. 10/229,903, Response filed Aug. 25, 2003 to Restriction Requirement mailed Jul. 25, 2003", 6 pgs.

"U.S. Appl. No. 10/229,903, Restriction Requirement mailed Jul. 25, 2003", 6 pgs.

"U.S. Appl. No. 10/929,822, Final Office Action mailed Jul. 31, 2007", 7 pgs.

"U.S. Appl. No. 10/929,822, Non Final Office Action mailed Jan. 25, 2007", 9 pgs.

"U.S. Appl. No. 10/929,822, Non Final Office Action mailed Jul. 12, 2006", 15 pgs.

"U.S. Appl. No. 10/929,822, Notice of Allowance mailed Nov. 6, 2007", 4 pgs.

"U.S. Appl. No. 10/929,822, Response filed Apr. 24, 2007 to Non Final Office Action mailed Jan. 25, 2007", 12 pgs.

"U.S. Appl. No. 10/929,822, Response filed Oct. 1, 2007 to Final Office Action mailed Jul. 31, 2007", 6 pgs.

"U.S. Appl. No. 10/929,822, Response filed Oct. 12, 2006 to Non Final Office Action mailed Jul. 12, 2006", 12 pgs.

"U.S. Appl. No. 10/930,516, Non Final Office Action mailed Mar. 8, 2007", 7 pgs.

"U.S. Appl. No. 10/930,516, Notice of Allowance mailed Aug. 10, 2007", 9 pgs.

"U.S. Appl. No. 10/930,516, Response filed Apr. 26, 2006 to Restriction Requirement mailed Mar. 28, 2006", 9 pgs.

"U.S. Appl. No. 10/930,516, Response filed Jun. 8, 2007 to Non Final Office Action mailed Mar. 8, 2007", 15 pgs.

"U.S. Appl. No. 10/930,516, Response filed Jun. 9, 2006 to Restriction Requirement mailed May 9, 2006", 10 pgs.

"U.S. Appl. No. 10/930,516, Restriction Requirement mailed Mar. 28, 2006", 5 pgs.

(56) References Cited

OTHER PUBLICATIONS

"U.S. Appl. No. 11/176,738, Non Final Office Action mailed May 16, 2006", 19 pgs.
"U.S. Appl. No. 11/176,738, Notice of Allowance mailed Nov. 14, 2006", 5 pgs.
"U.S. Appl. No. 11/176,738, Response filed Aug. 16, 2006 to Non-Final Office Action mailed May 16, 2006", 18 pgs.
"U.S. Appl. No. 11/176,738, Restriction Requirement mailed Mar. 16, 2006", 5 pgs.
"U.S. Appl. No. 11/216,375, Non Final Office Action mailed Jul. 11, 2006", 11 pgs.
"U.S. Appl. No. 11/216,375, Notice of Allowance mailed Dec. 22, 2006", 8 pgs.
"U.S. Appl. No. 11/216,375, Response filed Oct. 9, 2006 to Non-Final Office Action mailed Jul. 11, 2006", 14 pgs.
"U.S. Appl. No. 11/217,767, Non-Final Office Action mailed Nov. 28, 2007", 9 pgs.
"U.S. Appl. No. 11/217,767, Response filed Nov. 15, 2007 to Restriction Requirement mailed Oct. 15, 2007", 7 pgs.
"U.S. Appl. No. 11/217,767, Restriction Requirement mailed Oct. 15, 2007", 5 pgs.
"U.S. Appl. No. 11/217,771, Non-Final Office Action mailed Oct. 5, 2007", 33 pgs.
"U.S. Appl. No. 11/217,771, Response filed Jan. 2, 2008 to Non-Final Office Action mailed Oct. 5, 2007", 15 pgs.
"U.S. Appl. No. 11/333,885, Preliminary Amendment filed Jan. 18, 2006", 3 pgs.
"U.S. Appl. No. 11/333,885, Restriction Requirement filed Dec. 31, 2007", 5 pgs.
"U.S. Appl. No. 11/333,910, Non-Final Office Action mailed Aug. 8, 2007", 14 pgs.
"U.S. Appl. No. 11/333,910, Response filed Nov. 8, 2007 to Non-Final Office Action mailed Aug. 8, 2007", 10 pgs.
"U.S. Appl. No. 11/514,533, Notice of Allowance mailed Jan. 14, 2008", 10 pgs.
"U.S. Appl. No. 11/514,533, Notice of Allowance mailed May 28, 2008", 6 pgs.
"U.S. Appl. No. 11/514,533, Notice of Allowance mailed Sep. 14, 2007", 6 pgs.
"U.S. Appl. No. 11/514,533, Preliminary Amendment filed Feb. 7, 2008", 14 pgs.
"U.S. Appl. No. 11/514,533, Preliminary Amendment filed Dec. 14, 2007", 4 pgs.
"U.S. Appl. No. 11/514,545, Non Final Office Action mailed Jul. 24, 2008", 21 pgs.
"U.S. Appl. No. 11/514,545, Notice of Allowance mailed Jan. 30, 2009", 7 pgs.
"U.S. Appl. No. 11/514,545, Response filed Jul. 2, 2008 to Restriction Requirement mailed Jun. 9, 2008", 16 pgs.
"U.S. Appl. No. 11/514,545, Response filed Oct. 24, 2008 to Non-Final Office Action mailed Jul. 24, 2008", 17 pgs.
"U.S. Appl. No. 11/514,545, Restriction Requirement mailed Jun. 9, 2008", 6 pgs.
"U.S. Appl. No. 11/514,558, Final Office Action mailed Oct. 2, 2009", 24 pgs.
"U.S. Appl. No. 11/514,601, Non Final Office Action mailed Sep. 29, 2009", 12 pgs.
"U.S. Appl. No. 11/514,655, Final Office Action mailed Dec. 24, 2008", 11 pgs.
"U.S. Appl. No. 11/514,655, Non Final Office Action mailed May 19, 2008", 3 pgs.
"U.S. Appl. No. 11/514,655, Non-Final Office Action mailed Apr. 23, 2009", 9 pgs.
"U.S. Appl. No. 11/514,655, Response filed Mar. 24, 2009 to Final Office Action mailed Dec. 24, 2008", 11 pgs.
"U.S. Appl. No. 11/514,655, Response filed Jul. 23, 2009 to Non-Final Office Action mailed Apr. 23, 2009", 12 pgs.
"U.S. Appl. No. 11/514,655, Response filed Aug. 12, 2008 to Non-Final Office Action mailed May 19, 2008", 10 pgs.

"U.S. Appl. No. 11/515,114, Non Final Office Action mailed Oct. 29, 2008", 15 pgs.
"U.S. Appl. No. 11/515,114, Notice of Allowance mailed Apr. 23, 2009", 17 pgs.
"U.S. Appl. No. 11/515,114, Notice of Allowance mailed May 18, 2009", 10 pgs.
"U.S. Appl. No. 11/515,114, Notice of Non-Compliant Amendment mailed May 12, 2008", 2 pgs.
"U.S. Appl. No. 11/515,114, Response filed Jan. 29, 2009 to Non-Final Office Action mailed Oct. 29, 2008", 12 pgs.
"U.S. Appl. No. 11/515,114, Response filed Jun. 3, 2008 to Notice of Non-Compliant Amendment mailed May 12, 2008", 6 pgs.
"U.S. Appl. No. 11/515,114, Response filed Nov. 19, 2007 to Restriction Requirement mailed Nov. 6, 2007", 7 pgs.
"U.S. Appl. No. 11/515,114, Restriction Requirement mailed Nov. 6, 2007", 6 pgs.
"Tantalum Lanthanide Oxynitride Films", U.S. Appl. No. 11/514,545, filed Aug. 31, 2006.
Ahn, et al., "ALD of Zr-Substituted BaTiO3 Films As Gate Dielectrics", U.S. Appl. No. 11/498,559, filed Aug. 3, 2006 Client Ref No. 06-0094.
Ahn, K Y, "ALD of Silicon Films on Germanium", U.S. Appl. No. 11/498,576, filed Aug. 3, 2006.
Ahn, K Y, "Atomic Layer Deposited Barium Strontium Titanium Oxide Films", U.S. Appl. No. 11/510,803, filed Aug. 26, 2006.
Ahn, K Y, "Atomic Layer Deposited Titanium-Doped Indium Oxide Films", U.S. Appl. No. 11/400,836, filed Apr. 7, 2006.
Ahn, K Y, "Deposition of ZrAlON Films", U.S. Appl. No. 11/498,578, filed Aug. 3, 2006.
Ahn, Kie Y, "ALD of Amorphous Lanthanide Doped Tiox Films", U.S. Appl. No. 11/092,072, filed Mar. 29, 2005, 04-1321.
Ahn, Kie Y, "Atomic Layer Deposited Hafnium Tantalum Oxide Dielectrics", U.S. Appl. No. 11/029,757, filed Jan. 5, 2005.
Ahn, Kie Y, "Atomic Layer Deposited Lanthanum Aluminum Oxide Dielectric Layer", U.S. Appl. No. 10/930,167, filed Aug. 31, 2004, 04-0686.
Ahn, Kie Y, "Atomic Layer Deposited Lanthanum Hafnium Oxide Dielectrics", U.S. Appl. No. 11/010,529, filed Dec. 13, 2004.
Ahn, Kie Y, "Atomic Layer Deposited Titanium Aluminum Oxide Films", U.S. Appl. No. 10/931,533, filed Aug. 31, 2004, client ref No. 04-0579.
Ahn, Kie Y, "Atomic Layer Deposited Titanium Silicon Oxide Films", U.S. Appl. No. 11/093,104, filed Mar. 29, 2005, 05-0019.
Ahn, Kie Y, "Atomic Layer Deposited Zirconium Silicon Oxide Films", U.S. Appl. No. 11/117,121, filed Apr. 28, 2005, 05-0061.
Ahn, Kie Y, "Atomic Layer Deposition of a Ruthenium Layer to a Lanthanide Oxide Dielectric Layer", U.S. Appl. No. 11/117,125, filed Apr. 28, 2005, 05-0116.
Ahn, Kie Y, "Atomic Layer Deposition of CEO2/AL2O3 Films As Gate Dielectrics", U.S. Appl. No. 11/055,380, filed Feb. 10, 2005, 04-1094.
Ahn, Kie Y, "Atomic Layer Deposition of DY-Doped HFO2 Films As Gate Dielectrics", U.S. Appl. No. 11/053,577, filed Feb. 8, 2005, 04-1179.
Ahn, Kie Y, "Atomic Layer Deposition of Hf3N4/HfO2 Films As Gate Dielectrics", U.S. Appl. No. 11/063,717, filed Feb. 23, 2005, 04-1248.
Ahn, Kie Y., et al., "Atomic Layer Deposition of Zirconium-Doped Tantalum Oxide Films", U.S. Appl. No. 10/909,959, filed Aug. 2, 2004.
Ahn, Kie Y, "Atomic Layer Deposition of Zr3N4/ZrO2 Films As Gate Dielectrics", U.S. Appl. No. 11/058,563, filed Feb. 15, 2005.
Ahn, Kie Y, "Atomic Layer Deposition of ZRX HFY SN1-X-Y O2 Films As High K Gate Dielectrics", U.S. Appl. No. 11/215,530, filed Aug. 29, 2005, 05-0311.
Ahn, Kie Y, "Cobalt Titanium Oxide Dielectric Films", U.S. Appl. No. 11/216,958, filed Aug. 31, 2005, 05-0523.
Ahn, Kie Y, "Gallium Lanthanide Oxide Films", (U.S. Appl. No. 11/329,025, filed Jan. 10, 2006 (Client Ref. No. 05-0873).
Ahn, Kie Y, et al., "Hafnium Lanthanide Oxynitride Films", U.S. Appl. No. 11/515,143, filed Aug. 31, 2006.
Ahn, Kie Y, "Hafnium Tantalum Titanium Oxide Films", U.S. Appl. No. 11/297,741, filed Dec. 8, 2005, 05-0782.

(56) References Cited

OTHER PUBLICATIONS

Ahn, Kie Y, "Hafnium Titanium Oxide Films", U.S. Appl. No. 11/140,643, filed May 27, 2005, 05-0172.

Ahn, Kie Y, "Hybrid ALD-CVD of PrXOY/ZrO2 Films As Gate Dielectrics", U.S. Appl. No. 11/010,766, filed Dec. 13, 2004, 04-0997.

Ahn, Kie Y, "Iridium / Zirconium Oxide Structure", U.S. Appl. No. 11/152,759, filed Jun. 14, 2005, 05-0201.

Ahn, Kie Y, et al., "Lanthanide Yttrium Aluminum Oxide Dielectric Films", U.S. Appl. No. 11/297,567, filed Dec. 8, 2005, 05-0711.

Ahn, Kie Y, "Lanthanum Aluminum Oxynitride Dielectric Films", U.S. Appl. No. 11/216,474, filed Aug. 31, 2005, 05-0565.

Ahn, Kie Y, et al., "Magnesium Titanium Oxide Films", U.S. Appl. No. 11/189,075, filed Jul. 25, 2005, 05-0381.

Ahn, Kie Y, "Ruthenium Gate for a Lanthanide Oxide Dielectric Layer", U.S. Appl. No. 10/926,812, filed Aug. 26, 2004, client ref No. 04-0538.

Ahn, Kie Y., et al., "Semiconductor Constructions Comprising Cerium Oxide and Titanium Oxide; and Methods of Forming Semiconductor Constructions", U.S. Appl. No. 10/881,874, filed Jun. 29, 2004 (Client Ref. No. 04-0207).

Ahn, Kie Y, "Zirconium-Doped Gadolinium Oxide Films", U.S. Appl. No. 11/215,578, filed Aug. 29, 2005, 05-0597.

Forbes, et al., "Metal Substituted Transistor Gates", U.S. Appl. No. 11/176,738, filed Jul. 7, 2005.

Forbes, et al., "Metal-Substituted Transistor Gates", U.S. Appl. No. 11/445,000 mailed Jun. 1, 2006.

Gartner, M., et al., "Spectroellipsometric characterization of lanthanide-doped TiO/sub 2/ films obtained via the sol-gel technique", Thin Solid Films, 234(1-2), (1993), 561-565.

Jeong, Chang-Wook, "Plasma-Assisted Atomic Layer Growth of High-Quality Aluminum Oxide Thin Films", Japanese Journal of Applied Physics, Part 1: Regular Papers and Short Notes and Review Papers, 40(1), (Jan. 2001), 285-289.

Keomany, D., et al., "Sol gel preparation of mixed cerium-titanium oxide thin films", Solar Energy Materials and Solar Cells, 33(4), (Aug. 1994), 429-441.

Kim, C. T, et al., "Application of Al2O3 Grown by Atomic Layer Deposition to DRAM and FeRAM", International Symposium in Integrated Ferroelectrics, (Mar. 2000), 316.

Lee, Byoung Hun, et al., "Ultrathin Hafnium Oxide with Low Leakage and excellent Reliability for Alternative Gate Dielectric Application", IEEE Technical Digest of International Electron Devices Meeting 1999, (1999), 133-136.

Leskela, M., "ALD precursor chemistry: Evolution and future challenges", J. Phys. IV France, 9, (1999), 837-852.

Muller, D. A., et al., "The electronic structure at the atomic scale of ultrathin gate oxides", Nature, 399, (Jun. 24, 1999), 758-61.

Shanware, A, et al., "Reliability evaluation of HfSiON gate dielectric film with 12.8 A SiO2 equivalent thickness", International Electron Devices Meeting. Technical Digest, (2001), 6.6.1-6.6.4.

Shin, Chang Ho, "Fabrication and Characterization of MFISFET Using Al2O3 Insulating Layer for Non-volatile Memory", 12th International Symposium in Integrated Ferroelectrics, (Mar. 2000), 9 pages.

Sneh, Ofer, "Thin film atomic layer deposition equipment for semiconductor processing", Thin Solid Films, 402(1-2), Preparation and Characterization, Elsevier Sequoia, NL, vol. 402, No. 1-2, (2002), 248-261.

Van Dover, R. B., "Amorphous lanthanide-doped TiOx dielectric films", Applied Physics Letters, 74(20), (May 17, 1999), 3041-3043.

Weldon, M. K., et al., "Physics and Chemistry of Silicon Wafer bonding Investigated by Infrared Absorption Spectroscopy", Journal of Vacuum Sci. Technology, B 14(4), c1996 American Vacuum Society, (Jul./Aug. 1996), 3095-3106.

Wolf, Stanley, et al., "Silicon Processing for the VLSI Era—vol. I: Process Technology", Second Edition, Lattice Press, Sunset Beach, California, (2000), 443.

* cited by examiner

CONDUCTIVE LAYERS FOR HAFNIUM SILICON OXYNITRIDE

RELATED APPLICATIONS

This application is a continuation of U.S. application Ser. No. 12/772,473, filed May 3, 2010, now issued as U.S. Pat. No. 8,067,794, which is a divisional of U.S. application Ser. No. 11/355,490 filed Feb. 16, 2006, now issued as U.S. Pat. No. 7,709,402, both of which are incorporated herein by reference in their entirety.

This application is related to the commonly assigned application U.S. application Ser. No. 10/229,903, filed on 28 Aug. 2002, now issued as U.S. Pat. No. 7,199,023, which application is incorporated herein by reference.

TECHNICAL FIELD

This application relates generally to semiconductor devices and device fabrication.

BACKGROUND

The semiconductor device industry has a market driven need to reduce the size of devices used in products such as processor chips, mobile telephones, and memory devices such as dynamic random access memories (DRAMs). Currently, the semiconductor industry relies on the ability to reduce or scale the dimensions of its basic devices. This device scaling includes scaling dielectric layers in devices such as, for example, capacitors and silicon based metal oxide semiconductor field effect transistors (MOSFETs), which have primarily been fabricated using silicon dioxide. A thermally grown amorphous $SiO_2$ layer provides an electrically and thermodynamically stable material, where the interface of the $SiO_2$ layer with underlying silicon provides a high quality interface as well as superior electrical isolation properties. However, increased scaling and other requirements in microelectronic devices have created the need to use other materials as dielectric regions in a variety of electronic structures.

DETAILED DESCRIPTION

Figure 1:
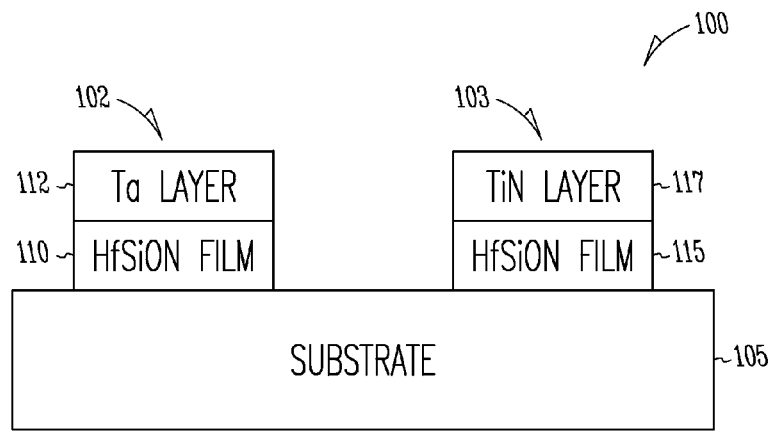
FIG. 1 illustrates a block diagram of an embodiment of an electronic apparatus having two devices on a substrate, where one device has a tantalum layer contacting a hafnium silicon oxynitride film and the other device has a titanium nitride layer contacting a hafnium silicon oxynitride film.

The following detailed description refers to the accompanying drawings that show, by way of illustration, embodiments in which the present invention may be practiced. These embodiments are described in sufficient detail to enable those skilled in the art to practice the present invention. Other embodiments may be utilized and structural, logical, and electrical changes may be made without departing from the scope of the present invention. The various embodiments are not necessarily mutually exclusive, as some embodiments can be combined with one or more other embodiments to form new embodiments.

The terms wafer and substrate used in the following description include any structure having an exposed surface with which to form an integrated circuit (IC) structure. The term substrate is understood to include a semiconductor wafer. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to generally include n-type and p-type semiconductors and the term insulator or dielectric is defined to include any material that is less electrically conductive than the materials referred to as conductors. The following detailed description is, therefore, not to be taken in a limiting sense.

To scale a dielectric region to minimize feature sizes to provide high density electronic devices, the dielectric region typically should have a reduced equivalent oxide thickness ($t_{eq}$). The equivalent oxide thickness quantifies the electrical properties, such as capacitance, of the dielectric in terms of a representative physical thickness. $t_{eq}$ is defined as the thickness of a theoretical $SiO_2$ layer that would be required to have the same capacitance density as a given dielectric, ignoring leakage current and reliability considerations.

A $SiO_2$ layer of thickness, t, deposited on a Si surface will have a $t_{eq}$ larger than its thickness, t. This $t_{eq}$ results from the capacitance in the surface on which the $SiO_2$ is deposited due to the formation of a depletion/inversion region. This depletion/inversion region can result in $t_{eq}$ being from 3 to 6 Angstroms (Å) larger than the $SiO_2$ thickness, t. Thus, with the semiconductor industry driving to someday scale a gate dielectric equivalent oxide thickness to less than 10 Å, the physical thickness requirement for a SiO$_2$ layer used for a gate dielectric may need to be approximately 4 to 7 Å. Additional requirements on a SiO$_2$ layer would depend on the electrode used in conjunction with the SiO$_2$ dielectric. Using a conventional polysilicon electrode may result in an additional increase in t$_{eq}$ for the SiO$_2$ layer. This additional thickness may be eliminated by using a metal electrode, though such metal electrodes are not universally used for all devices. Thus, future devices would be designed towards a physical SiO$_2$ dielectric layer of about 5 Å or less. Such a small thickness requirement for a SiO$_2$ oxide layer creates additional problems.

Silicon dioxide is used as a dielectric layer in devices, in part, due to its electrical isolation properties in a SiO$_2$—Si based structure. This electrical isolation is due to the relatively large band gap of SiO$_2$ (8.9 eV), making it a good insulator from electrical conduction. Significant reductions in its band gap may eliminate it as a material for a dielectric region in an electronic device. As the thickness of a SiO$_2$ layer decreases, the number of atomic layers, or monolayers of the material decreases. At a certain thickness, the number of monolayers will be sufficiently small that the SiO$_2$ layer will not have a complete arrangement of atoms as in a larger or bulk layer. As a result of incomplete formation relative to a bulk structure, a thin SiO$_2$ layer of only one or two monolayers may not form a full band gap. The lack of a full band gap in a SiO$_2$ dielectric may cause an effective short between an underlying Si electrode and an overlying polysilicon electrode. This undesirable property sets a limit on the physical thickness to which a SiO$_2$ layer can be scaled. The minimum thickness due to this monolayer effect is thought to be about 7-8 Å. Therefore, for future devices to have a t$_{eq}$ less than about 10 Å, other dielectrics than SiO$_2$ need to be considered for use as a dielectric region in such future devices.

In many cases, for a typical dielectric layer, the capacitance may be determined as a capacitance for a parallel plate capacitor: $C=\kappa\epsilon_0 A/t$, where $\kappa$ is the dielectric constant, $\epsilon_0$ is the permittivity of free space, A is the area of the capacitor, and t is the thickness of the dielectric. The thickness, t, of a material is related to its t$_{eq}$ for a given capacitance, with SiO$_2$ having a dielectric constant $\kappa_{ox}$=3.9, as $$t=(\kappa/\kappa_{ox})t_{eq}=(\kappa/3.9)t_{eq}.$$

Thus, materials with a dielectric constant greater than that of SiO$_2$ will have a physical thickness that can be considerably larger than a desired t$_{eq}$, while providing the desired equivalent oxide thickness. For example, an alternate dielectric material with a dielectric constant of 10 could have a thickness of about 25.6 Å to provide a t$_{eq}$ of 10 Å, not including any depletion/inversion layer effects. Thus, a reduced equivalent oxide thickness for transistors can be realized by using dielectric materials with higher dielectric constants than SiO$_2$.

The thinner equivalent oxide thickness required for lower device operating voltages and smaller device dimensions may be realized by a significant number of materials, but additional fabricating requirements make determining a suitable replacement for SiO$_2$ difficult. The current view for the microelectronics industry is still for Si based devices. This may require that the dielectric material employed be grown on a silicon substrate or a silicon layer, which places significant constraints on the substitute dielectric material. During the formation of the dielectric on the silicon layer, there exists the possibility that a small layer of SiO$_2$ could be formed in addition to the desired dielectric. The result would effectively be a dielectric layer consisting of two sublayers in parallel with each other and the silicon layer on which the dielectric is formed. In such a case, the resulting capacitance would be that of two dielectrics in series. As a result, the t$_{eq}$ of the dielectric layer would be the sum of the SiO$_2$ thickness and a multiplicative factor of the thickness, t, of the dielectric being formed, written as $$t_{eq}=t_{SiO2}+(\kappa_{ox}/\kappa)t.$$

Thus, if a SiO$_2$ layer is formed in the process, the t$_{eq}$ is again limited by a SiO$_2$ layer. In the event that a barrier layer is formed between the silicon layer and the desired dielectric in which the barrier layer prevents the formation of a SiO$_2$ layer, the t$_{eq}$ would be limited by the layer with the lowest dielectric constant. However, whether a single dielectric layer with a high dielectric constant or a barrier layer with a higher dielectric constant than SiO$_2$ is employed, the layer interfacing with the silicon layer should provide a high quality interface.

One of the advantages of using SiO$_2$ as a dielectric layer in a device has been that the formation of the SiO$_2$ layer results in an amorphous dielectric. Having an amorphous structure for a dielectric may reduce problems of leakage current associated with grain boundaries in polycrystalline dielectrics that provide high leakage paths. Additionally, grain size and orientation changes throughout a polycrystalline dielectric can cause variations in the film's dielectric constant, along with uniformity and surface topography problems. Typically, materials having a high dielectric constant relative to SiO$_2$ also have a crystalline form, at least in a bulk configuration. The best candidates for replacing SiO$_2$ as a dielectric in a device are those that can be fabricated as a thin layer with an amorphous form and that have high dielectric constants.

An embodiment of a method may include forming a hafnium silicon oxynitride film using atomic layer deposition and forming, on the hafnium silicon oxynitride film, a titanium nitride layer or a tantalum layer by atomic layer deposition. Embodiments include structures and methods to form such structures for capacitors, transistors, memory devices, and electronic systems with dielectric layers containing a hafnium silicon oxynitride oxide layer structured as one or more monolayers with a conductive tantalum layer or a conductive titanium nitride layer structured as one or more monolayers.

In an embodiment, a hafnium silicon oxynitride dielectric film coupled to a titanium nitride layer, a tantalum layer, or a combination of a titanium nitride layer and a tantalum layer may be formed using atomic layer deposition (ALD) including forming the titanium nitride layer and the tantalum layer a by atomic layer deposition. Various approaches for forming a hafnium silicon oxynitride dielectric film by atomic layer deposition are discussed in application Ser. No. 10/229,903, entitled "ATOMIC LAYER DEPOSITED HfSiON DIELECTRIC FILMS," filed on 28 Aug. 2002, which application is incorporated herein by reference. Forming such structures using atomic layer deposition may allow control of transitions between material layers. As a result of such control, atomic layer deposited hafnium silicon oxynitride dielectric films can have an engineered transition with a substrate surface and with atomic layer deposited conductive layers contacting the hafnium silicon oxynitride dielectric films.

ALD, also known as atomic layer epitaxy (ALE), is a modification of chemical vapor deposition (CVD) and is also called "alternatively pulsed-CVD." In ALD, gaseous precursors are introduced one at a time to the substrate surface mounted within a reaction chamber (or reactor). This introduction of the gaseous precursors takes the form of pulses of each gaseous precursor. In a pulse of a precursor gas, the precursor gas is made to flow into a specific area or region for a short period of time. Between the pulses, the reaction chamber may be purged with a gas, where the purging gas may be an inert gas. Between the pulses, the reaction chamber may be evacuated. Between the pulses, the reaction chamber may be purged with a gas and evacuated.

In a chemisorption-saturated ALD (CS-ALD) process, during the first pulsing phase, reaction with the substrate occurs with the precursor saturatively chemisorbed at the substrate surface. Subsequent pulsing with a purging gas removes precursor excess from the reaction chamber.

The second pulsing phase introduces another precursor on the substrate where the growth reaction of the desired film takes place. Subsequent to the film growth reaction, reaction byproducts and precursor excess are purged from the reaction chamber. With favourable precursor chemistry where the precursors adsorb and react with each other aggressively on the substrate, one ALD cycle can be performed in less than one second in properly designed flow type reaction chambers. Typically, precursor pulse times range from about 0.5 sec to about 2 to 3 seconds. Pulse times for purging gases may be significantly longer, for example, pulse times of about 5 to about 30 seconds.

In ALD, the saturation of all the reaction and purging phases makes the growth self-limiting. This self-limiting growth results in large area uniformity and conformality, which has important applications for such cases as planar substrates, deep trenches, and in the processing of porous silicon and high surface area silica and alumina powders. Atomic layer deposition provides control of film thickness in a straightforward manner by controlling the number of growth cycles.

The precursors used in an ALD process may be gaseous, liquid or solid. However, liquid or solid precursors should be volatile. The vapor pressure should be high enough for effective mass transportation. Also, solid and some liquid precursors may need to be heated inside the reaction chamber and introduced through heated tubes to the substrates. The necessary vapor pressure should be reached at a temperature below the substrate temperature to avoid the condensation of the precursors on the substrate. Due to the self-limiting growth mechanisms of ALD, relatively low vapor pressure solid precursors can be used, though evaporation rates may vary somewhat during the process because of changes in their surface area.

There are several other characteristics for precursors used in ALD. The precursors should be thermally stable at the substrate temperature, because their decomposition may destroy the surface control and accordingly the advantages of the ALD method that relies on the reaction of the precursor at the substrate surface. A slight decomposition, if slow compared to the ALD growth, may be tolerated.

The precursors should chemisorb on or react with the surface, though the interaction between the precursor and the surface as well as the mechanism for the adsorption is different for different precursors. The molecules at the substrate surface should react aggressively with the second precursor to form the desired solid film. Additionally, precursors should not react with the film to cause etching, and precursors should not dissolve in the film. Using highly reactive precursors in ALD contrasts with the selection of precursors for conventional CVD.

The by-products in the reaction should be gaseous in order to allow their easy removal from the reaction chamber. Further, the by-products should not react or adsorb on the surface.

In a reaction sequence ALD (RS-ALD) process, the self-limiting process sequence involves sequential surface chemical reactions. RS-ALD relies on chemistry between a reactive surface and a reactive molecular precursor. In an RS-ALD process, molecular precursors are pulsed into the ALD reaction chamber separately. A metal precursor reaction at the substrate is typically followed by an inert gas pulse to remove excess precursor and by-products from the reaction chamber prior to pulsing the next precursor of the fabrication sequence.

By RS-ALD, films can be layered in equal metered sequences that may all be identical in chemical kinetics, deposition per cycle, composition, and thickness. RS-ALD sequences generally deposit less than a full layer per cycle. Typically, a deposition or growth rate of about 0.25 to about 2.00 Å per RS-ALD cycle may be realized.

Processing by RS-ALD provides continuity at an interface avoiding poorly defined nucleating regions that are typical for chemical vapor deposition (<20 Å) and physical vapor deposition (<50 Å), conformality over a variety of substrate topologies due to its layer-by-layer deposition technique, use of low temperature and mildly oxidizing processes, lack of dependence on the reaction chamber, growth thickness dependent solely on the number of cycles performed, and ability to engineer multilayer laminate films with a resolution of one to two monolayers. RS-ALD processes allow for deposition control on the order of monolayers and the ability to deposit monolayers of amorphous films.

Herein, a sequence refers to the ALD material formation based on an ALD reaction of a precursor with its reactant precursor. For example, forming titanium nitride from a $TiCl_4$ precursor and $NH_3$, as its reactant precursor, forms an embodiment of a titanium/nitrogen sequence. In various ALD processes that form a nitride or a compound that contains nitrogen, a reactant precursor that contains nitrogen is used to supply nitrogen. Herein, a precursor that contains nitrogen and that supplies nitrogen to be incorporated in the ALD compound formed, which may be used in an ALD process with precursors supplying the other elements in the ALD compound, is referred to as a nitrogen reactant precursor. In the above example, $NH_3$ is a nitrogen reactant precursor. Similarly, an ALD sequence for a binary metal oxide may be referenced with respect to the metal and oxygen. For example, an ALD sequence for hafnium oxide may also be referred to as a hafnium/oxygen sequence. In various ALD processes that form an oxide or a compound that contains oxygen, a reactant precursor that contains oxygen is used to supply the oxygen. Herein, a precursor that contains oxygen and that supplies oxygen to be incorporated in the ALD compound formed, which may be used in an ALD process with precursors supplying the other elements in the ALD compound, is referred to as an oxygen reactant precursor. With an ALD process using $HfCl_4$ and water vapor to form hafnium oxide, water vapor is an oxygen reactant precursor. An ALD cycle may include pulsing a precursor, pulsing a purging gas for the precursor, pulsing a reactant precursor, and pulsing the reactant precursor's purging gas. An ALD cycle may include pulsing a precursor, evacuating the reactant chamber, pulsing a reactant precursor, and evacuating the reactant chamber. An ALD cycle may include pulsing a precursor, pulsing a purging gas for the precursor and evacuating the reactant chamber, pulsing a reactant precursor, and pulsing the reactant precursor's purging gas evacuating the reactant chamber.

In forming a layer of a metal species, an ALD sequence may deal with pulsing a reactant precursor to the substrate surface on which a metal-containing species has been adsorbed such that the reactant precursor reacts with the metal-containing species resulting in the metal and a gaseous by-product that can be removed during the subsequent purging/evacuating process. Alternatively, in forming a layer of a metal species, an ALD sequence may deal with reacting a precursor containing the metal species with a substrate surface. A cycle for such a metal forming sequence may include pulsing a purging gas after pulsing the precursor containing the metal species to deposit the metal. Additionally, deposition of a semiconductor material may be realized in a manner similar to forming a layer of a metal, given the appropriate precursors for the semiconductor material.

In an ALD formation of a compound having more than two elements, a cycle may include a number of sequences to provide the elements of the compound. For example, a cycle for an ALD formation of an $ABO_x$ compound may include sequentially pulsing a first precursor/a purging gas for the first precursor/a first reactant precursor/the first reactant precursor's purging gas/a second precursor/a purging gas for the second precursor/a second reactant precursor/the second reactant precursor's purging gas, which may be viewed as a cycle having two sequences. In an embodiment, a cycle may include a number of sequences for element A and a different number of sequences for element B. There may be cases in which ALD formation of an $ABO_x$ compound uses one precursor that contains the elements A and B, such that pulsing the AB containing precursor followed by its reactant precursor onto a substrate may include a reaction that forms $ABO_x$ on the substrate to provide an AB/oxygen sequence. A cycle of an AB/oxygen sequence may include pulsing a precursor containing A and B, pulsing a purging gas for the precursor, pulsing an oxygen reactant precursor to the A/B precursor, and pulsing a purging gas for the reactant precursor. A cycle may be repeated a number of times to provide a desired thickness of the compound. In an embodiment, a cycle for an ALD formation of the quaternary compound, hafnium silicon oxynitride, may include sequentially pulsing a first precursor/a purging gas for the first precursor/a first reactant precursor/the first reactant precursor's purging gas/a second precursor/a purging gas for the second precursor/a second reactant precursor/the second reactant precursor's purging gas/a third precursor/a purging gas for the third precursor/a third reactant precursor/the third reactant precursor's purging gas, which may be viewed as a cycle having three sequences. In an embodiment, a layer substantially of a hafnium silicon oxygen nitrogen compound is formed on a substrate mounted in a reaction chamber using ALD in repetitive hafnium/oxygen and silicon/nitrogen sequences using precursor gases individually pulsed into the reaction chamber. After forming the hafnium silicon oxygen nitrogen layer, an ALD tantalum sequence may be conducted to form a tantalum layer on the hafnium silicon oxygen nitrogen layer. After forming the hafnium silicon oxygen nitrogen layer, an ALD titanium/nitrogen sequence may be conducted to form a titanium nitride layer on the hafnium silicon oxygen nitrogen layer. Solid or liquid precursors can be used in an appropriately designed reaction chamber.

In an embodiment, a hafnium silicon oxynitride layer may be structured as one or more monolayers. A film of hafnium silicon oxynitride, structured as one or more monolayers, may have a thickness that ranges from a monolayer to thousands of angstroms or more. The film may be processed using atomic layer deposition. Embodiments of an atomic layer deposited hafnium silicon oxynitride layer have a larger dielectric constant than silicon dioxide. Such dielectric layers provide a significantly thinner equivalent oxide thickness compared with a silicon oxide layer having the same physical thickness. Alternatively, such dielectric layers provide a significantly thicker physical thickness than a silicon oxide layer having the same equivalent oxide thickness. This increased physical thickness aids in reducing leakage current.

In an embodiment, a tantalum layer may be structured as one or more monolayers. A layer of tantalum, structured as one or more monolayers, may have a thickness that ranges from a monolayer to thousands of angstroms or more. The tantalum film may be processed using atomic layer deposition. In an embodiment, a titanium nitride layer may be structured as one or more monolayers. A layer of titanium nitride, structured as one or more monolayers, may have a thickness that ranges from a monolayer to thousands of angstroms or more. The titanium nitride film may be processed using atomic layer deposition.

The term hafnium silicon oxynitride is used herein with respect to a compound that essentially consists of hafnium, silicon, oxygen, and nitrogen in a form that may be stoichiometric, non-stoichiometric, or a combination of stoichiometric and non-stoichiometric. A hafnium silicon oxynitride film may also be referred to as a hafnium silicon oxygen nitrogen film. Other nomenclature for a compound that essentially consists of hafnium, silicon, oxygen, and nitrogen may be known to those skilled in the art. In an embodiment, hafnium silicon oxynitride may be formed substantially as stoichiometric hafnium silicon oxynitride. In an embodiment, hafnium silicon oxynitride may be formed substantially as a non-stoichiometric hafnium silicon oxynitride. In an embodiment, hafnium silicon oxynitride may be formed substantially as a combination of non-stoichiometric hafnium silicon oxynitride and stoichiometric hafnium silicon oxynitride. Herein, a hafnium silicon oxynitride compound may be expressed as HfSiON, $HfSiON_x$, $Hf_xSi_yO_zN_r$, or other equivalent form. The expression HfSiON or its equivalent forms may be used to include a stoichiometric hafnium silicon oxynitride. The expression HfSiON or its equivalent forms may be used to include a non-stoichiometric hafnium silicon oxynitride. The expression HfSiON or its equivalent forms may be used to include a combination of a stoichiometric hafnium silicon oxynitride and a non-stoichiometric hafnium silicon oxynitride. The expression $HfO_x$ may be used to include a stoichiometric hafnium oxide. The expression $HfO_x$ may be used to include a non-stoichiometric hafnium oxide. The expression $HfO_x$ may be used to include a combination of a stoichiometric hafnium oxide and a non-stoichiometric hafnium oxide. Expressions $SiO_z$, $SiN_r$, $HfN_r$, and $TiN_s$ may be used in the same manner as $HfO_x$. In various embodiments, a hafnium silicon oxynitride film may be doped with elements or compounds other than hafnium, silicon, oxygen, and nitrogen.

In an embodiment, a $HfSiON_x$ film may be structured as one or more monolayers. In an embodiment, the $HfSiON_x$ film may be constructed using atomic layer deposition. Prior to forming the $HfSiON_x$ film using ALD, the surface on which the $HfSiON_x$ film is to be deposited may undergo a preparation stage. The surface may be the surface of a substrate for an integrated circuit. In an embodiment, the substrate used for forming a transistor may include a silicon or silicon containing material. In other embodiments, germanium, gallium arsenide, silicon-on-sapphire substrates, or other suitable substrates may be used. A preparation process may include cleaning the substrate and forming layers and regions of the substrate, such as drains and sources, prior to forming a gate dielectric in the formation of a metal oxide semiconductor (MOS) transistor. Alternatively, active regions may be formed after forming the dielectric layer, depending on the over-all fabrication process implemented. In an embodiment, the substrate is cleaned to provide an initial substrate depleted of its native oxide. In an embodiment, the initial substrate is cleaned also to provide a hydrogen-terminated surface. In an embodiment, a silicon substrate undergoes a final hydrofluoric (HF) rinse prior to ALD processing to provide the silicon substrate with a hydrogen-terminated surface without a native silicon oxide layer.

Cleaning immediately preceding atomic layer deposition aids in reducing an occurrence of silicon oxide as an interface between a silicon based substrate and a hafnium silicon oxynitride dielectric formed using the atomic layer deposition process. The material composition of an interface layer and its properties are typically dependent on process conditions and the condition of the substrate before forming the dielectric layer. Though the existence of an interface layer may effectively reduce the dielectric constant associated with the dielectric layer and its substrate interface layer, a $SiO_2$ interface layer or other composition interface layer may improve the interface density, fixed charge density, and channel mobility of a device having this interface layer.

The sequencing of the formation of the regions of an electronic device, such as a transistor, being processed may follow typical sequencing that is generally performed in the fabrication of such devices as is well known to those skilled in the art. Included in the processing prior to forming a dielectric may be the masking of substrate regions to be protected during the dielectric formation, as is typically performed in semiconductor fabrication. In an embodiment, the unmasked region includes a body region of a transistor; however, one skilled in the art will recognize that other semiconductor device structures may utilize this process.

In various embodiments, between each pulsing of a precursor used in an atomic layer deposition process, a purging gas may be pulsed into the ALD reaction chamber. Between each pulsing of a precursor, the ALD reactor chamber may be evacuated using vacuum techniques as is known by those skilled in the art. Between each pulsing of a precursor, a purging gas may be pulsed into the ALD reaction chamber and the ALD reactor chamber may be evacuated.

In an embodiment, alternate layers of hafnium oxide and silicon nitride may be formed by atomic layer deposition. The alternating hafnium oxide and silicon nitride layers may be annealed to form hafnium silicon oxynitride.

To form hafnium oxide by atomic layer deposition, a hafnium-containing precursor is pulsed onto a substrate in an ALD reaction chamber. A number of precursors containing hafnium may be used to provide the hafnium to a substrate for an integrated circuit. In an embodiment, a precursor containing hafnium may include anhydrous hafnium nitride, $Hf(NO_3)_4$. In an embodiment using a $Hf(NO_3)_4$ precursor on a hydrogen-terminated silicon, the substrate temperature may be maintained at a temperature ranging from about 160° C. to about 180° C. In an embodiment, a hafnium precursor may include $HfCl_4$. In an embodiment using a $HfCl_4$ precursor, the substrate temperature may be maintained at a temperature ranging from about 180° C. to about 600° C. In an embodiment using a $HfCl_4$ precursor, the substrate temperature may be maintained at a temperature ranging from about 300° C. to about 940° C. In an embodiment, a hafnium precursor may be $HfI_4$. In an embodiment using a $HfI_4$ precursor, the substrate temperature may be maintained at a temperature of about 300° C. Hafnium oxide may be grown by ALD using a $Hf[N(CH_3)(C_2H_5)]_4$, which may be known as a homoleptic tetrakis (dialkylamino) hafnium(IV) compound, and water as an oxygen reactant. Other types of tetrakis(dialkylamino) hafnium compounds may also be used, such as hafnium tetrakis dimethylamine, $Hf[N(CH_3)_2]_4$, or hafnium tetrakis diethylamine, $Hf[N(C_2H_5)_2]_4$, as a hafnium-containing precursor. In various embodiments, after pulsing the hafnium-containing precursor and purging the reaction chamber of excess precursor and by-products from pulsing the precursor, a reactant precursor may be pulsed into the reaction chamber. The reactant precursor may be an oxygen reactant precursor including, but not limited to, one or more of water vapor, atomic oxygen, molecular oxygen, ozone, hydrogen peroxide, a water-hydrogen peroxide mixture, alcohol, or nitrous oxide. In various embodiments, use of the individual hafnium-containing precursors is not limited to the temperature ranges of the above example embodiments. Further, forming hafnium oxide by atomic layer deposition is not limited to the abovementioned precursors. In addition, the pulsing of the hafnium precursor may use a pulsing period that provides uniform coverage of a monolayer on the surface or may use a pulsing period that provides partial coverage of a monolayer on the surface during a hafnium sequence.

To form silicon nitride by atomic layer deposition, a silicon-containing precursor is pulsed onto a substrate in an ALD reaction chamber. In an embodiment, a silicon halide, such as $SiCl_4$, may be used. Other silicon halides, such as $SiI_3$, may be used. For the pulsing of the $SiCl_4$ precursor, the substrate may be maintained at a temperature ranging from about 340° C. to about 375° C. at a gas pressure in reaction chamber at about 170 Torr. In an embodiment, the substrate may be maintained at a temperature less than 550° C. In an embodiment, $NH_3$ may be used as the nitrogen-containing precursor for a silicon/nitrogen sequence. In various embodiments, use of the individual silicon-containing precursors is not limited to the temperature ranges of the above example embodiments. Further, forming silicon nitride by atomic layer deposition is not limited to the abovementioned precursors. In addition, the pulsing of the silicon precursor may use a pulsing period that provides uniform coverage of a monolayer on the surface or may use a pulsing period that provides partial coverage of a monolayer on the surface during a silicon sequence.

In various embodiments, nitrogen may be used as a purging gas and a carrier gas for one or more of the sequences. Alternatively, hydrogen, argon gas, or other inert gases may be used as the purging gas. Excess precursor gas and reaction by-products may be removed by the purge gas. Excess precursor gas and reaction by-products may be removed by evacuation of the reaction chamber using various vacuum techniques. Excess precursor gas and reaction by-products may be removed by the purge gas and by evacuation of the reaction chamber.

In an embodiment, alternate layers of hafnium nitride and silicon oxide may be formed by atomic layer deposition. The alternating hafnium nitride and silicon oxide layers may be annealed to form hafnium silicon oxynitride.

To form hafnium nitride by atomic layer deposition, a hafnium-containing precursor is pulsed onto a substrate in an ALD reaction chamber. A number of precursors containing hafnium may be used to provide the hafnium to a substrate for an integrated circuit. The hafnium-containing precursor may be a hafnium halide precursor. In an embodiment, a hafnium precursor may include $HfCl_4$. In an embodiment using a $HfCl_4$ precursor, the substrate temperature may be maintained at a temperature ranging from about 180° C. to about 600° C. In an embodiment using a $HfCl_4$ precursor, the substrate temperature may be maintained at a temperature ranging from about 300° C. to about 940° C. In an embodiment, a hafnium precursor used may be $HfI_4$. In an embodiment using a $HfI_4$ precursor, the substrate temperature may be maintained at a temperature of about 300° C. In addition to halide precursors, the hafnium nitride may be grown by ALD using a $Hf[N(CH_3)(C_2H_5)]_4$ and ammonia, $NH_3$. In an embodiment, the substrate may be held at a temperature ranging from about 150° C. to about 300° C. Other types of tetrakis(dialkylamino) metal compounds may also be used, such as hafnium tetrakis dimethylamine, Hf[N(CH$_3$)$_2$]$_4$, or hafnium tetrakis diethylamine, Hf[N(C$_2$H$_5$)$_2$]$_4$, as a hafnium-containing precursor with ammonia as a nitrogen reactant precursor. In various embodiments, after pulsing the hafnium-containing precursor and purging the reaction chamber of excess precursor and by-products from pulsing the precursor, a reactant precursor may be pulsed into the reaction chamber. The reactant precursor may be a nitrogen reactant precursor including, but not limited to, ammonia. In various embodiments, use of the individual hafnium-containing precursors is not limited to the temperature ranges of the above embodiments. Further, forming hafnium nitride by atomic layer deposition is not limited to the abovementioned precursors. In addition, the pulsing of the hafnium precursor may use a pulsing period that provides uniform coverage of a monolayer on the surface or may use a pulsing period that provides partial coverage of a monolayer on the surface during a hafnium sequence.

To form silicon oxide by atomic layer deposition, a silicon-containing precursor is pulsed onto a substrate in an ALD reaction chamber. A silicon halide precursor may be used as the silicon-containing precursor. In an embodiment, SiCl$_4$ is used as the silicon-containing precursor. Other silicon halides, such as SiI$_4$, may be used. In an embodiment, during pulsing of the SiCl$_4$, the substrate may be held between about 340° C. and about 375° C. For a silicon sequence using SiCl$_4$ as the precursor, oxygen, in the form of O$_2$ or O$_3$, may be used as the precursor acting as an oxidizing reactant to interact at the substrate. In an embodiment, during the oxygen pulsing, the substrate may be raised to a temperature significantly higher than the temperature used during the pulsing of the precursor containing silicon. In an embodiment, the temperature for the substrate may be at about 550° C. during the oxygen pulsing. In various embodiments, use of the individual silicon-containing precursors is not limited to the temperature ranges of the above embodiments. Further, forming silicon oxide by atomic layer deposition is not limited to the abovementioned precursors. In addition, the pulsing of the silicon precursor may use a pulsing period that provides uniform coverage of a monolayer on the surface or may use a pulsing period that provides partial coverage of a monolayer on the surface during a silicon sequence. In an embodiment, forming a silicon oxide by atomic layer deposition is conducted after an initial hafnium nitride layer is formed on a silicon-based substrate to limit the size or occurrence of a silicon oxide interface between a HfSiON layer and the silicon-based substrate.

Atomic layer deposition of the individual components or layers of HfO$_x$, SiN$_r$, SiO$_z$, and/or HfN$_t$ allows for individual control of each precursor pulsed into the reaction chamber. Thus, each precursor is pulsed into the reaction chamber for a predetermined period, where the predetermined period can be set separately for each precursor. Additionally, for various ALD formations, each precursor may be pulsed into the reaction chamber under separate environmental conditions. The substrate may be maintained at a selected temperature and the reaction chamber maintained at a selected pressure independently for pulsing each precursor. Appropriate temperatures and pressures may be maintained, whether the precursor is a single precursor or a mixture of precursors.

The layers of hafnium oxide and silicon nitride and/or layers of hafnium nitride and silicon oxide may be annealed to form hafnium silicon oxynitride. In an embodiment, a laminated stack of alternating layers of HfO$_2$ and Si$_2$N$_3$ are formed prior to annealing. In an embodiment, a laminated stack of alternating layers of Hf$_3$N$_4$ and SiO$_2$ are formed prior to annealing. In various embodiments, the order of forming HfO$_x$ and SiN$_r$ layers may be permutated. In various embodiments, the order of forming SiO$_z$ and HfN$_t$ layers may be permutated. In an embodiment, alternating layers of HfO$_x$ and SiN$_r$ are formed with alternating layers of SiO$_z$ and HfN$_t$ to form a dielectric stack, which is annealed to form hafnium silicon oxynitride. The dielectric stack may be formed as a layer of hafnium silicon oxynitride. The annealing may be conducted in a nitrogen ambient. In an embodiment, annealing may be conducted in a nitrogen ambient having a small amount of oxygen. However, annealing is not limited to these ambient conditions.

In an embodiment, a layer of hafnium oxide and a layer of silicon nitride are each grown by atomic layer deposition to a thickness such that annealing these layers at appropriate temperatures essentially converts these layers to a layer of hafnium silicon oxynitride. In an embodiment, each layer of HfO$_x$ and SiN$_r$ may be formed to a thickness of 10 Å or less. In the various embodiments, the thickness of a hafnium silicon oxynitride film is related to the number of ALD cycles performed and the growth rate associated with forming each layer of HfO$_x$ and SiN$_r$.

In an embodiment, a layer of hafnium nitride and a layer of silicon oxygen are each grown by atomic layer deposition to a thickness such that annealing these layers at appropriate temperatures essentially converts these layers to a layer of hafnium silicon oxynitride. In an embodiment, each layer of SiO$_z$ and HfN$_t$ may be formed to a thickness of 10 Å or less. In the various embodiments, the thickness of a hafnium silicon oxynitride film is related to the number of ALD cycles performed and the growth rate associated with forming each layer of SiO$_z$ and HfN$_t$.

In an embodiment, a HfSiON film may be grown to a desired thickness by repetition of a process including atomic layer deposition of layers of HfO$_x$ and SiN$_r$ and/or layers of SiO$_z$ and HfN$_t$ followed by annealing. In an embodiment, a base thickness may be formed according to various embodiments such that forming a predetermined thickness of a HfSiON film may be conducted by forming a number of layers having the base thickness. As can be understood by one skilled in the art, determining the base thickness depends on the application and can be determined during initial processing without undue experimentation. Relative amounts of hafnium, silicon, oxygen, and nitrogen in a HfSiON film may be controlled by regulating the relative thicknesses of the individual layers of oxides and nitrides formed. In addition, relative amounts of hafnium, silicon, oxygen, and nitrogen in a HfSiON film may be controlled by forming a layer of HfSiON as multiple layers of different base thickness and by regulating the relative thicknesses of the individual layers of oxides and nitrides formed in each base layer prior to annealing. As can be understood by those skilled in the art, particular effective growth rates for the engineered hafnium silicon oxynitride film can be determined during normal initial testing of the ALD system used in processing a hafnium silicon oxynitride dielectric for a given application without undue experimentation.

In an alternative embodiment, an ALD cycle for forming HfSiON may include sequencing component-containing precursors in the order of hafnium, oxygen, silicon, and nitrogen with appropriate purging between the different component-containing precursors, in which partial coverage of a monolayer on a substrate surface is attained for pulsing of a metal-containing precursor. An ALD cycle for forming HfSiON may include sequencing the component-containing precursors in various permutations. In an embodiment, an ALD cycle to form hafnium silicon oxynitride may include a number, x, of hafnium/oxygen sequences and a number, y, of silicon/nitrogen sequences. The number of sequences x and y may be selected to engineer the relative amounts of hafnium, silicon, oxygen, and nitrogen. In an embodiment, the number of sequences x and y may be selected to form a hafnium-rich hafnium silicon oxynitride. Alternatively, the number of sequences x and y may be selected to form a silicon-rich hafnium silicon oxynitride. In an embodiment, an ALD cycle to form hafnium silicon oxynitride may include a number, z, of hafnium/nitrogen sequences and a number, r, of silicon/oxygen sequences. The number of sequences z and r may be selected to engineer the relative amounts of hafnium, silicon, oxygen, and nitrogen. In an embodiment, the number of sequences z and r may be selected to form a hafnium-rich hafnium silicon oxynitride. Alternatively, the number of sequences z and r may be selected to form a silicon-rich hafnium silicon oxynitride.

After repeating a selected number of ALD cycles, a determination may be made as to whether the number of cycles equals a predetermined number to form the desired hafnium silicon oxynitride layer. If the total number of cycles to form the desired thickness has not been completed, a number of cycles is repeated. The thickness of a hafnium silicon oxynitride layer formed by atomic layer deposition may be determined by a fixed growth rate for the pulsing periods and precursors used, set at a value such as N nm/cycle, and the number of cycles conducted. Depending on the precursors used for ALD formation of a HfSiON film, the process may be conducted in an ALD window, which is a range of temperatures in which the growth rate is substantially constant. If such an ALD window is not available, the ALD process may be conducted at the same set of temperatures for each ALD sequence in the process. For a desired hafnium silicon oxynitride layer thickness, t, in an application, the ALD process is repeated for t/N total cycles. Once the t/N cycles have completed, no further ALD processing for the hafnium silicon oxynitride layer is required. A hafnium silicon oxynitride layer processed at relatively low temperatures associated with atomic layer deposition may provide an amorphous layer.

In various embodiments, either before or after forming a HfSiON film, other dielectric layers such as nitride layers, dielectric metal silicates, insulating materials including $HfO_x$, $SiN_r$, and $SiO_z$, and lanthanide oxides or combinations thereof may be formed as part of a dielectric layer or dielectric stack. These one or more other layers of dielectric material may be provided in stoichiometric form, in non-stoichiometric form, or a combination of stoichiometric dielectric material and non-stoichiometric dielectric material. Depending on the application, a dielectric stack containing a $HfSiON_x$ film may include a silicon oxide layer. In an embodiment, the dielectric layer may be formed as a nanolaminate. An embodiment of a nanolaminate may include a layer of a hafnium oxide and a $HfSiON_x$ film, a layer of silicon nitride and a $HfSiON_x$ film, a layer of silicon oxide and a $HfSiON_x$ film, layers of hafnium oxide, silicon nitride, and silicon oxide along with a $HfSiON_x$ film, or various other combinations. Alternatively, a dielectric layer may be formed substantially as the hafnium silicon oxynitride film.

In various embodiments, the structure of an interface between a dielectric layer and a substrate on which it is disposed is controlled to limit the inclusion of silicon oxide, since a silicon oxide layer would reduce the effective dielectric constant of the dielectric layer. The material composition and properties for an interface layer may be dependent on process conditions and the condition of the substrate before forming the dielectric layer. Though the existence of an interface layer may effectively reduce the dielectric constant associated with the dielectric layer and its substrate, the interface layer, such as a silicon oxide interface layer or other composition interface layer, may improve the interface density, fixed charge density, and channel mobility of a device having this interface layer.

In an embodiment, the hafnium silicon oxynitride layer may be doped with other elements. The doping may be employed to enhance the leakage current characteristics of the dielectric layer containing the $HfSiON_x$ film by providing a disruption or perturbation of the hafnium silicon oxynitride structure. Such doping may be realized by substituting a sequence of one of these elements for a hafnium sequence, a silicon sequence, or various combinations of sequences. The choice for substitution may depend on the form of the hafnium silicon oxynitride structure with respect to the relative amounts of hafnium atoms and silicon atoms desired in the oxide. To maintain a substantially hafnium silicon oxynitride, the amount of dopants inserted into the oxynitride may be limited to a relatively small fraction of the total number of hafnium and silicon atoms.

In an embodiment, a $HfSiON_x$ film may be engineered to have a dielectric constant, the value of which lies in the range from about 7 to about 14. As the hafnium content increases, the dielectric constant increases such that a value above 20 may be attained for a hafnium-rich $HfSiON_x$ film. In an embodiment, a dielectric layer containing a hafnium silicon oxynitride layer may have a $t_{eq}$ ranging from about 5 Å to about 20 Å. In an embodiment, a dielectric layer containing a hafnium silicon oxynitride layer may have a $t_{eq}$ of less than 5 Å. In an embodiment, a hafnium silicon oxynitride film may be formed with a thickness ranging from a monolayer to thousands of angstroms or more. Further, dielectric films of hafnium silicon oxynitride formed by atomic layer deposition may provide not only thin $t_{eq}$ films, but also films with relatively low leakage current. Additionally, embodiments may be implemented to form transistors, capacitors, memory devices, and other electronic systems including information handling devices.

In various embodiments, the composition of an HfSiON film relative to the amounts of component elements may be changed to change the characteristics of a HfSiON film including such properties as the work function, electron affinity, and other electrical characteristics. A HfSiON film may be structured to match conductive layers that are formed on the HfSiON to provide electrical contact. In an embodiment, a HfSiON film may be formed as a high-K dielectric insulator with conductive layers selected to provide operating characteristics for the electronic device in which the HfSiON film is disposed. In an embodiment, conductive layers are formed to contact a HfSiON film to configure a transistor with an optimum threshold voltage. In an embodiment, a gate dielectric having a HfSiON film is coupled to a gate having a tantalum layer. Tantalum as a low work function metal may be used in n-channel MOS (NMOS) transistors with a HfSiON gate dielectric to provide a threshold voltage of around 0.2 or 0.3 Volts. In an embodiment, a gate dielectric having a HfSiON film may be coupled to a gate having a titanium nitride layer. Titanium nitride having a higher work function than tantalum may be used as a gate in p-channel MOS (PMOS) transistors with a HfSiON gate dielectric to provide a threshold voltage of around 0.2 or 0.3 Volts. Titanium nitride may also be used as a gate in a NMOS transistor. In various embodiments, tantalum or titanium nitride may be used as capacitor plates in capacitor structures having a capacitor dielectric containing a HfSiON film. The choice of tantalum or titanium nitride may depend on considerations such as reliability, ease of process, and other factors. Embodiments having tunneling structures, such as flash and non-volatile read only memory (NROM) devices, choice of tantalum or titanium nitride may depend on the desired tunnel barrier, using a large work function to provide a high barrier to reduce tunneling or using a lower work function to provide a low barrier.

A tantalum layer may be formed with a HfSiON$_x$ film by atomic layer deposition using a tantalum-containing precursor that is pulsed onto the HfSiON$_x$ film in an ALD reaction chamber. In an embodiment, a tantalum halide precursor, such as TaF$_5$ or TaCl$_5$, may be used with hydrogen as a reactant precursor. In an embodiment, a TaCl$_5$ precursor may be used with an atomic hydrogen reactant precursor. The atomic hydrogen reactant precursor may be provided using a plasma. In an embodiment, the substrate temperature may be held at a temperature ranging from about 250° C. to about 400° C. The hydrogen reactant precursor reacts at the substrate to remove the halogen, which forms the selected tantalum halide precursor, leaving tantalum on the substrate surface. After pulsing a tantalum-containing precursor and after pulsing its reactant precursor, the reaction chamber may be purged of excess precursor and/or by-products. In various embodiments, use of the individual tantalum-containing precursors is not limited to the temperature ranges of the above example embodiments. Further, forming tantalum by atomic layer deposition is not limited to the abovementioned precursors. In addition, the pulsing of the tantalum precursor may use a pulsing period that provides uniform coverage of a monolayer on the surface or may use a pulsing period that provides partial coverage of a monolayer on the surface. The tantalum layer may be structured as one or more monolayers. The tantalum layer may a thickness ranging from a monolayer to thousands of angstroms or more.

A titanium nitride layer may be formed with a HfSiON$_x$ film by atomic layer deposition using a titanium-containing precursor that is pulsed onto the HfSiON$_x$ film in an ALD reaction chamber. A nitrogen-containing precursor may be used as the reactant precursor for the titanium-containing precursor. The titanium-containing precursor and the nitrogen-containing precursor may be selected such that their use does not form a titanium oxide in the layer of titanium nitride being formed. The titanium-containing precursor and the nitrogen-containing precursor may be selected such that these precursors do not include oxygen as an elemental component. In an embodiment, a titanium halide precursor, such as TiCl$_4$, TiI$_4$, or TiF$_4$, may be used with NH$_3$ as a reactant precursor. In an embodiment, a TiCl$_4$ precursor may be used with a NH$_3$ reactant precursor. In an embodiment, the substrate temperature may be held at a temperature ranging from about 380° C. to about 500° C. In an embodiment, the substrate temperature may be held at a temperature less than 600° C. After pulsing a titanium-containing precursor and after pulsing its reactant precursor, the reaction chamber may be purged of excess precursor and/or by-products. In various embodiments, use of the individual titanium-containing precursors is not limited to the temperature ranges of the above example embodiments. Further, forming titanium nitride by atomic layer deposition is not limited to the abovementioned precursors. In addition, the pulsing of the titanium precursor may use a pulsing period that provides uniform coverage of a monolayer on the surface or may use a pulsing period that provides partial coverage of a monolayer on the surface. The titanium nitride layer may be structured as one or more monolayers. The titanium nitride layer may a thickness ranging from a monolayer to thousands of angstroms or more.

FIG. 1 illustrates a block diagram of an embodiment of an electronic apparatus 100 having two devices 102, 103 on a substrate 105, where device 102 has a tantalum layer 112 contacting a hafnium silicon oxynitride film 110 and device 103 has a titanium nitride layer 117 contacting a hafnium silicon oxynitride film 115. Device 102 may include a transistor with hafnium silicon oxynitride film 110 as a gate dielectric and tantalum layer 112 as part of the corresponding gate. The transistor may be a NMOS transistor. Device 102 may include a capacitor with hafnium silicon oxynitride film 110 as a capacitor dielectric and tantalum layer 112 as part of the capacitor electrode. Such a capacitor may be structured as a DRAM capacitor. Such a capacitor may be structured as a capacitor in analog circuit, a radio frequency (RF) circuit, a mixed signal circuit, or combinations of these circuits. Mixed signal integrated circuits are integrated circuits that may operate with digital and analog signals. Device 103 may include a transistor with hafnium silicon oxynitride film 115 as a gate dielectric and titanium nitride layer 117 as part of the corresponding gate. The transistor may be a PMOS transistor. The transistor may be a NMOS transistor. Device 103 may include a capacitor with hafnium silicon oxynitride film 115 as a capacitor dielectric and titanium nitride layer 117 as part of the capacitor electrode. Such a capacitor may be structured as a DRAM capacitor. Such a capacitor may be structured as a capacitor in analog circuit, a RF circuit, a mixed signal circuit, or combinations of these circuits. In an embodiment, device 103 may be a PMOS transistor and device 102 may be a NMOS transistor in an integrated circuit.

Figure 2:
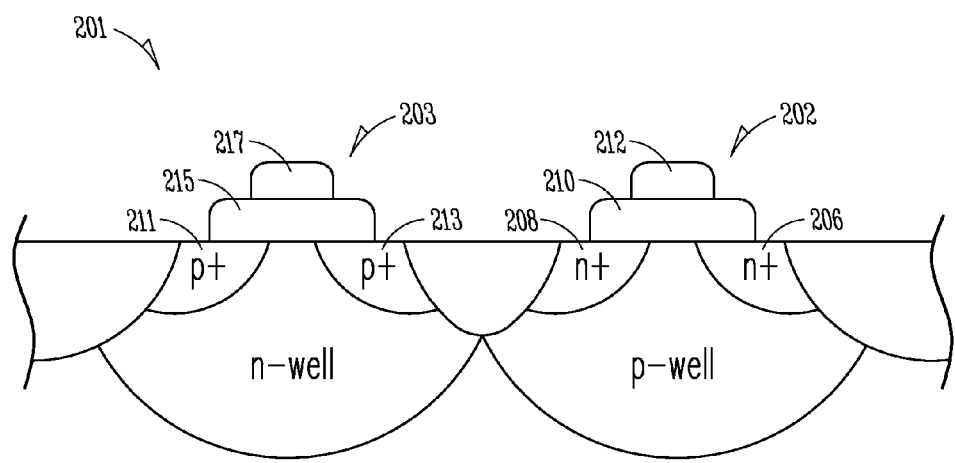
FIG. 2 shows a simplified view of an embodiment of a complementary metal oxide semiconductor transistor having a gate containing a tantalum layer contacting a gate insulator containing a hafnium silicon oxynitride film and a gate containing a titanium nitride layer contacting a gate insulator containing a hafnium silicon oxynitride film.

FIG. 2 shows a simplified view of an embodiment of a complementary metal oxide semiconductor (CMOS) transistor 201 having a PMOS transistor 203 including a titanium nitride layer and a hafnium silicon oxynitride film and a NMOS transistor 202 including a tantalum layer and a hafnium silicon oxynitride film. NMOS transistor 202 includes source/drain regions 206, 208, a gate 212 containing a tantalum layer contacting a gate insulator 210 containing a hafnium silicon oxynitride film. PMOS transistor 203 includes source/drain regions 211, 213, a gate 217 containing a titanium nitride layer contacting a gate insulator 215 containing a hafnium silicon oxynitride film. In various embodiments, a masking process may be employed such that one HfSiON layer is matched to a Ta gate and the second HfSiON layer is matched to a TiN gate. Such masking processes are known to those skilled in the art. Other arrangements may be used for a CMOS transistor using hafnium silicon oxynitride films with a titanium nitride gate and a tantalum gate.

Though a silicide layer may be selected for use as an electrode with various high-κ gate dielectrics, work function tuning by selecting the appropriate silicide to control threshold voltage may be limited by Fermi-level pinning. A CMOS structure using hafnium silicon oxynitride films with a titanium nitride gate and a tantalum gate provides a threshold voltage control technique that uses two different conductive layers with different work functions for the PMOS and NMOS transistors of the CMOS structure. In an embodiment, the use of two such different conductive layers as gates may be structured to provide substantially symmetrical threshold voltages. In an embodiment, a CMOS structure may have symmetrical threshold voltages in the range from about ±0.3V to about ±0.5V. Atomic layer deposition may be used to structure the HfSiON layers, the TiN layers, and the Ta layers to provide a high quality high-κ dielectric with TiN and Ta contacts and to reduce or minimize process damage in the formation of these layers.

The use of TiN and Ta as electrodes for HfSiON films may address the problems associated with gate depletion that is inherent in conventional poly-Si gates and the problems associated with Fermi-level pinning with poly-Si gates on high-κ gate dielectrics. Various embodiments of device structures having ALD-deposited TiN or ALD-deposited Ta as electrodes for ALD-deposited HfSiON films may address problems associated with electron mobilities being significantly less for transistors having metal/high-κ structures than for transistors having a poly-Si/SiO$_2$ structures. Such degradation of electron mobilities may be related to damage caused in typical transistor fabrication in addition to remote coulomb scattering due to a large number of residual charges in the metal electrodes to the high-κ dielectric. Fabrication problems in standard processes may include degrading the quality of the gate dielectric as a metal gate is formed on the gate dielectric by physical vapor deposition (PVD). In a PVD process, dielectric degradation may occur due to plasma radiation and mixing of elements at the metal/high-κ dielectric interface. Using a CVD process, unwanted residual impurities may be incorporated the metal/high-κ structures. In addition, annealing after forming a metal gate in these typical processes may further degrade the high-κ dielectric on which the metal gate is formed due to high temperatures associated with metal annealing, where elements of the high-κ dielectric may diffuse into the metal. Forming a HfSiON film with TiN or Ta electrodes in which all the components are formed by atomic layer deposition may avoid the problems accompanying other deposition techniques.

Figure 3:
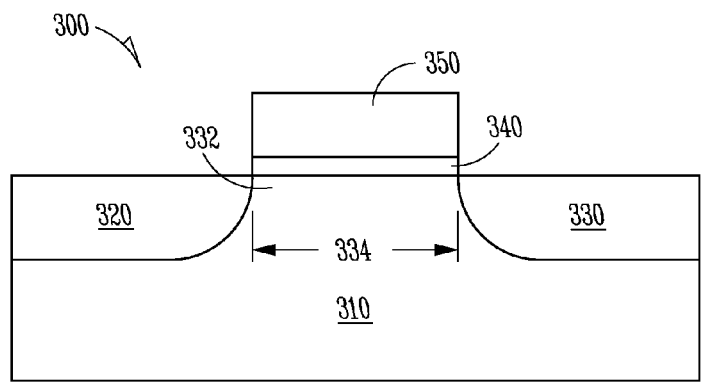
FIG. 3 shows an embodiment of a transistor having a dielectric layer containing a hafnium silicon oxynitride film and having a gate containing a tantalum layer, a titanium nitride layer, or a combination of a tantalum layer and a titanium nitride layer.

FIG. 3 shows an embodiment of a transistor 300 having a dielectric layer 340 containing a HfSiON$_x$ film. Transistor 300 may include a source region 320 and a drain region 330 in a silicon-based substrate 310 where source and drain regions 320, 330 are separated by a body region 332. Body region 332 defines a channel having a channel length 334. A gate dielectric 340 may be disposed on substrate 310 with gate dielectric 340 formed as a dielectric layer containing HfSiON$_x$. Gate dielectric 340 may be realized as a dielectric layer formed substantially of HfSiON$_x$. Gate dielectric 340 may be constructed as multiple dielectric layers, that is, as a dielectric stack, containing at least one HfSiON$_x$ film and one or more layers of insulating material other than a hafnium silicon oxynitride film. The HfSiON$_x$ film may be structured as one or more monolayers. An embodiment of a HfSiON$_x$ film may be formed using atomic layer deposition. In an embodiment, gate dielectric 340 may be realized as a gate insulator in a silicon-based CMOS transistor.

A gate 350 may be formed over and contact gate dielectric 340. Gate 350 may include a tantalum layer, a titanium nitride layer, or a combination of a tantalum layer and a titanium nitride layer. Gate 350 may include a tantalum layer structured as one or more monolayers. The tantalum layer may be an ALD tantalum layer. The thickness of the tantalum layer may range from a monolayer to thousands of angstroms or more. Gate 350 may be configured substantially as a tantalum layer. Gate 350 may include a titanium nitride layer structured as one or more monolayers. The titanium nitride layer may be an ALD titanium nitride layer. The thickness of the titanium nitride layer may range from a monolayer to thousands of angstroms or more. Gate 350 may be configured substantially as a titanium nitride layer.

An interfacial layer may form between body region and gate dielectric 340. In an embodiment, an interfacial layer may be limited to a relatively small thickness compared to gate dielectric 340, or to a thickness significantly less than gate dielectric 340 as to be effectively eliminated. Forming the substrate and the source and drain regions may be performed using standard processes known to those skilled in the art. Additionally, the sequencing of the various elements of the process for forming a transistor may be conducted with fabrication processes known to those skilled in the art. Transistor 300 may be an NMOS transistor. Transistor 300 may be a PMOS transistor. Transistor 300 is not limited to the arrangement illustrated in FIG. 3. Use of a gate dielectric containing hafnium silicon oxynitride is not limited to silicon based substrates, but may be used with a variety of semiconductor substrates.

Figure 4:
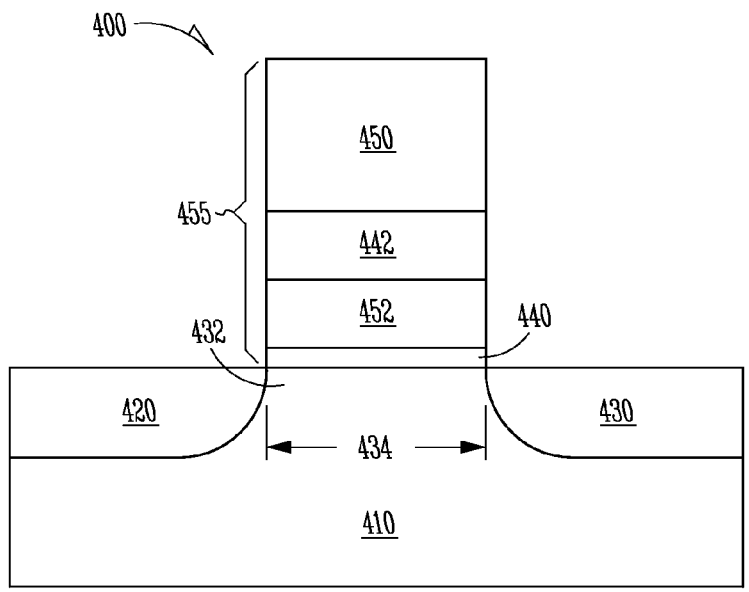
FIG. 4 shows an embodiment of a floating gate transistor having a dielectric layer containing a hafnium silicon oxynitride film and having a gate containing a tantalum layer, a titanium nitride layer, or a combination of a tantalum layer and a titanium nitride layer.

FIG. 4 shows an embodiment of a floating gate transistor 400 having a dielectric layer containing a HfSiON$_x$ film. The HfSiON$_x$ film may be structured as one or more monolayers. The HfSiON$_x$ film may be formed using atomic layer deposition techniques. Transistor 400 may include a silicon-based substrate 410 with a source 420 and a drain 430 separated by a body region 432. Body region 432 between source 420 and drain 430 defines a channel region having a channel length 434. Located above body region 432 is a stack 455 including a gate dielectric 440, a floating gate 452, a floating gate dielectric 442, and a control gate 450. An interfacial layer may form between body region 432 and gate dielectric 440. In an embodiment, an interfacial layer may be limited to a relatively small thickness compared to gate dielectric 440, or to a thickness significantly less than gate dielectric 440 as to be effectively eliminated.

In an embodiment, gate dielectric 440 includes a dielectric containing an atomic layer deposited HfSiON$_x$ film formed in embodiments similar to those described herein. Gate dielectric 440 may be realized as a dielectric layer formed substantially of HfSiON$_x$. Gate dielectric 440 may be a dielectric stack containing at least one HfSiON$_x$ film and one or more layers of other insulating materials.

In an embodiment, floating gate 452 may be formed over and contact gate dielectric 440. Floating gate 452 may include a tantalum layer, a titanium nitride layer, or a combination of a tantalum layer and a titanium nitride layer. Floating gate 452 may include a tantalum layer structured as one or more monolayers. The tantalum layer may be an ALD tantalum layer. The thickness of the tantalum layer may range from a monolayer to thousands of angstroms or more. Floating gate 452 may be configured substantially as a tantalum layer. Floating gate 452 may include a titanium nitride layer structured as one or more monolayers. The titanium nitride layer may be an ALD titanium nitride layer. The thickness of the titanium nitride layer may range from a monolayer to thousands of angstroms or more. Floating gate 452 may be configured substantially as a titanium nitride layer.

In an embodiment, floating gate dielectric 442 includes a dielectric containing a HfSiON$_x$ film. The HfSiON$_x$ film may be structured as one or more monolayers. In an embodiment, the HfSiON$_x$ may be formed using atomic layer deposition techniques. Floating gate dielectric 442 may be realized as a dielectric layer formed substantially of HfSiON$_x$. Floating gate dielectric 442 may be a dielectric stack containing at least one HfSiON$_x$ film and one or more layers of other insulating materials.

In an embodiment, control gate 450 may be formed over and contact floating gate dielectric 442. Control gate 450 may include a tantalum layer, a titanium nitride layer, or a combination of a tantalum layer and a titanium nitride layer. Control gate 450 may include a tantalum layer structured as one or more monolayers. The tantalum layer may be an ALD tantalum layer. The thickness of the tantalum layer may range from a monolayer to thousands of angstroms or more. Control gate 450 may be configured substantially as a tantalum layer. Control gate 450 may include a titanium nitride layer structured as one or more monolayers. The titanium nitride layer may be an ALD titanium nitride layer. The thickness of the titanium nitride layer may range from a monolayer to thousands of angstroms or more. Control gate 450 may be configured substantially as a titanium nitride layer.

Alternatively, both gate dielectric 440 and floating gate dielectric 442 may be formed as dielectric layers containing a HfSiON$_x$ film structured as one or more monolayers. Control gate 450 and floating gate 452 may be formed as conductive layers containing a Ta layer, a TiN$_s$ layer, or a combination of a Ta layer and a TiN$_s$ layer with each layer structured as one or more monolayers. Gate dielectric 440, floating gate dielectric 442, control gate 450, and floating gate 452 may be realized by embodiments similar to those described herein, with the remaining elements of the transistor 400 formed using processes known to those skilled in the art. In an embodiment, gate dielectric 440 forms a tunnel gate insulator and floating gate dielectric 442 forms an inter-gate insulator in flash memory devices, where gate dielectric 440 and floating gate dielectric 442 may include a hafnium silicon oxynitride film structured as one or more monolayers. Floating gate transistor 400 is not limited to the arrangement illustrated in FIG. 4. Such structures are not limited to silicon-based substrates, but may be used with a variety of semiconductor substrates.

Figure 5:
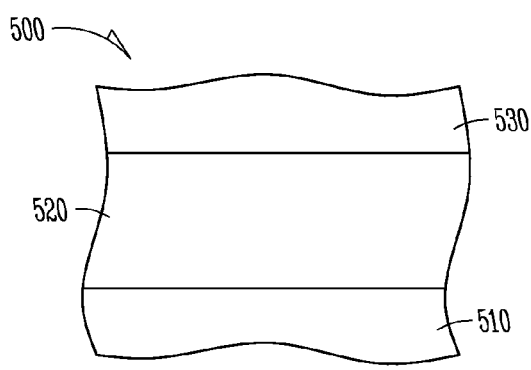
FIG. 5 shows an embodiment of a capacitor having a dielectric layer containing a hafnium silicon oxynitride film and having an electrode containing a tantalum layer, a titanium nitride layer, or a combination of a tantalum layer and a titanium nitride layer.

Embodiments of a hafnium silicon oxynitride film structured as one or more monolayers having a Ta or a TiN$_s$ electrode structured as one or more monolayers may also be applied to capacitors in various integrated circuits, memory devices, and electronic systems. In an embodiment for a capacitor 500 illustrated in FIG. 5, a method includes forming a first conductive layer 510, forming a dielectric layer 520 containing a hafnium silicon oxynitride film structured as one or more monolayers on first conductive layer 510, and forming a second conductive layer 530 on dielectric layer 520. Second conductive layer 530, first conductive layer 510 or both second and first conductive layers 530, 510 may include a Ta layer, a TiN$_s$ layer, or combination of a Ta layer and a TiN$_s$ layer. Dielectric layer 520, containing a HfSiON$_x$ film, and conductive layers 510, 520 may be formed using various embodiments described herein. Dielectric layer 520 may be realized as a dielectric layer formed substantially of HfSiON$_x$. Dielectric layer 520 may be a dielectric stack containing at least one HfSiON$_x$ film and one or more layers of other insulating materials. Embodiments for a hafnium silicon oxynitride film having a Ta conductive layer, a TiN$_s$ conductive layer, or a combination of a Ta conductive layer and a TiN$_s$ conductive layer structured as one or more monolayers may include, but are not limited to, a capacitor in a DRAM and capacitors in analog, radio frequency (RF), and mixed signal integrated circuits.

Figure 6:
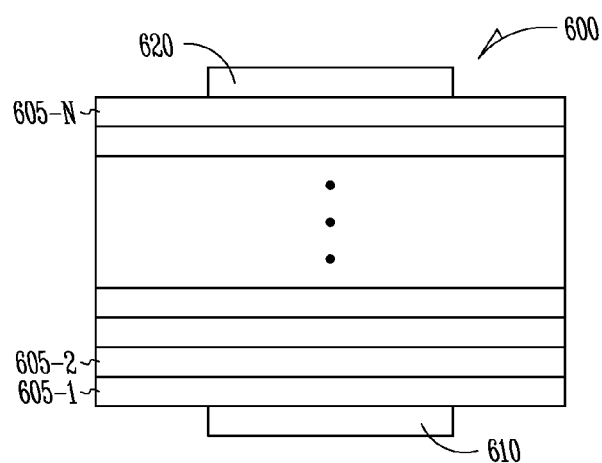
FIG. 6 depicts an embodiment of a dielectric layer having multiple layers including a hafnium silicon oxynitride layer and having a contact containing a tantalum layer, a titanium nitride layer, or a combination of a tantalum layer and a titanium nitride layer.

FIG. 6 depicts an embodiment of a dielectric structure 600 having multiple dielectric layers 605-1, 605-2, . . . 605-N, in which at least one layer is a hafnium silicon oxynitride layer. Layers 610 and 620 may provide means to contact dielectric layers 605-1, 605-2, . . . 605-N. Each layer 610, 620 or both layers may be conductive layers containing a Ta layer, a TiN$_s$ layer, or a combination of a Ta layer and a TiN$_s$ layer. Layers 610 and 620 may be electrodes forming a capacitor. Layer 610 may be a body region of a transistor with layer 620 being a gate. Layer 610 may be a floating gate electrode with layer 620 being a control gate.

In an embodiment, dielectric structure 600 includes one or more layers 605-1, 605-2 . . . 605-N as dielectric layers other than a HfSiON layer, where at least one layer is a HfSiON layer. Dielectric layers 605-1, 605-2 . . . 605-N may include a HfO$_x$ layer, a SiN$_r$ layer, a SiO$_z$ layer, a HfSiO layer, a SiON layer, or various combinations of these layers. Dielectric layers 605-1, 605-2 . . . 605-N may include an insulating metal oxide layer, whose metal is selected to be a metal different from hafnium. Dielectric layers 605-1, 605-2, . . . 605-N may include an insulating nitride layer. Dielectric layers 605-1, 605-2, . . . 605-N may include an insulating oxynitride layer. Dielectric layers 605-1, 605-2, . . . 605-N may include an insulating silicate layer.

Various embodiments for a dielectric layer containing a hafnium silicon oxynitride film structured as one or more monolayers may provide for enhanced device performance by providing devices with reduced leakage current. Such improvements in leakage current characteristics may be attained by forming one or more layers of a hafnium silicon oxynitride in a nanolaminate structure with other metal oxides, non-metal-containing dielectrics, or combinations thereof. The transition from one layer of the nanolaminate to another layer of the nanolaminate provides disruption to a tendency for an ordered structure in the nanolaminate stack. The term "nanolaminate" means a composite film of ultra thin layers of two or more materials in a layered stack. Typically, each layer in a nanolaminate has a thickness of an order of magnitude in the nanometer range. Further, each individual material layer of the nanolaminate may have a thickness as low as a monolayer of the material or as high as 20 nanometers. In an embodiment, a HfO$_x$/HfSiON nanolaminate contains alternating layers of a hafnium oxide and HfSiON. In an embodiment, a SiN$_y$/HfSiON nanolaminate contains alternating layers of silicon nitride and HfSiON. In an embodiment, a SiO$_z$/HfSiON nanolaminate contains alternating layers of silicon oxide and HfSiON. In an embodiment, a HfO$_x$/SiN$_y$/SiO$_z$/HfSiON nanolaminate contains various permutations of hafnium oxide layers, silicon nitride layers, silicon oxide layers, and hafnium silicon oxynitride layers.

In an embodiment, dielectric structure 600 may be structured as a nanolaminate structure 600 including a HfSiON$_x$ film structured as one or more monolayers. Nanolaminate structure 600 includes a plurality of layers 605-1, 605-2 to 605-N, where at least one layer contains a HfSiON$_x$ film structured as one or more monolayers. The other layers may be insulating nitrides, insulating oxynitrides, and other dielectric materials such as insulating metal oxides. The sequencing of the layers depends on the application. The effective dielectric constant associated with nanolaminate structure 600 is that attributable to N capacitors in series, where each capacitor has a thickness defined by the thickness and composition of the corresponding layer. By selecting each thickness and the composition of each layer, a nanolaminate structure can be engineered to have a predetermined dielectric constant. Embodiments for structures such as nanolaminate structure 600 may be used as nanolaminate dielectrics in NROM flash memory devices as well as other integrated circuits. In an embodiment, a layer of the nanolaminate structure 600 is used to store charge in a NROM device. The charge storage layer of a nanolaminate structure 600 in a NROM device may be a silicon oxide layer.

Transistors, capacitors, and other devices may include dielectric films containing a layer of a hafnium silicon oxynitride compound structured as one or more monolayers with a tantalum electrode, a titanium nitride electrode, or an electrode having a combination of a tantalum and a titanium nitride, the tantalum and titanium nitride structured as one or more monolayers. The hafnium silicon oxynitride layer, tantalum, and the titanium nitride may be formed by atomic layer deposition. Dielectric films containing a hafnium silicon oxynitride layer with a tantalum electrode, a titanium nitride electrode, or an electrode having a combination of a tantalum and a titanium nitride may be implemented into memory devices and electronic systems including information handling devices. Further, embodiments of electronic devices and electronic apparatus may be realized as integrated circuits. Embodiments of information handling devices may include wireless systems, telecommunication systems, and computers.

Figure 7:
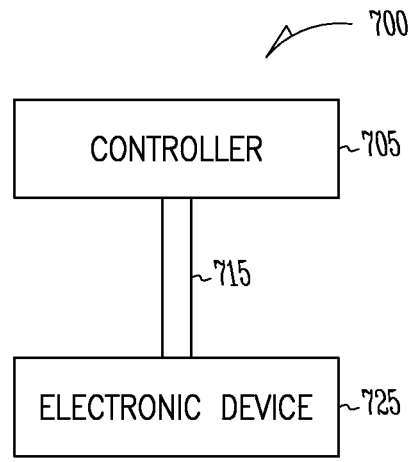
FIG. 7 is a simplified diagram for an embodiment of a controller coupled to an electronic device having a dielectric layer containing a hafnium silicon oxynitride film and having a contact to the dielectric layer, where the contact contains a tantalum layer, a titanium nitride layer, or a combination of a tantalum layer and a titanium nitride layer.

FIG. 7 illustrates a block diagram for an electronic system 700 having one or more devices having a dielectric structure including a HfSiON$_x$ film structured as one or more monolayers with a tantalum electrode, a titanium nitride electrode, or an electrode having a combination of a tantalum and a titanium nitride, the tantalum and titanium nitride structured as one or more monolayers. Electronic system 700 includes a controller 705, a bus 715, and an electronic device 725, where bus 715 provides electrical conductivity between controller 705 and electronic device 725. In various embodiments, controller 705 may include an embodiment of a HfSiON$_x$ film with a tantalum electrode, a titanium nitride electrode, or an electrode having a combination of a tantalum and a titanium nitride. In various embodiments, electronic device 725 may include an embodiment of a HfSiON$_x$ film with a tantalum electrode, a titanium nitride electrode, or an electrode having a combination of a tantalum and a titanium nitride. In various embodiments, controller 705 and electronic device 725 may include embodiments of a HfSiON$_x$ film with a tantalum electrode, a titanium nitride electrode, or an electrode having a combination of a tantalum and a titanium nitride. Electronic system 700 may include, but is not limited to, fiber optic systems, electro-optic systems, and information handling systems such as wireless systems, telecommunication systems, and computers.

Figure 8:
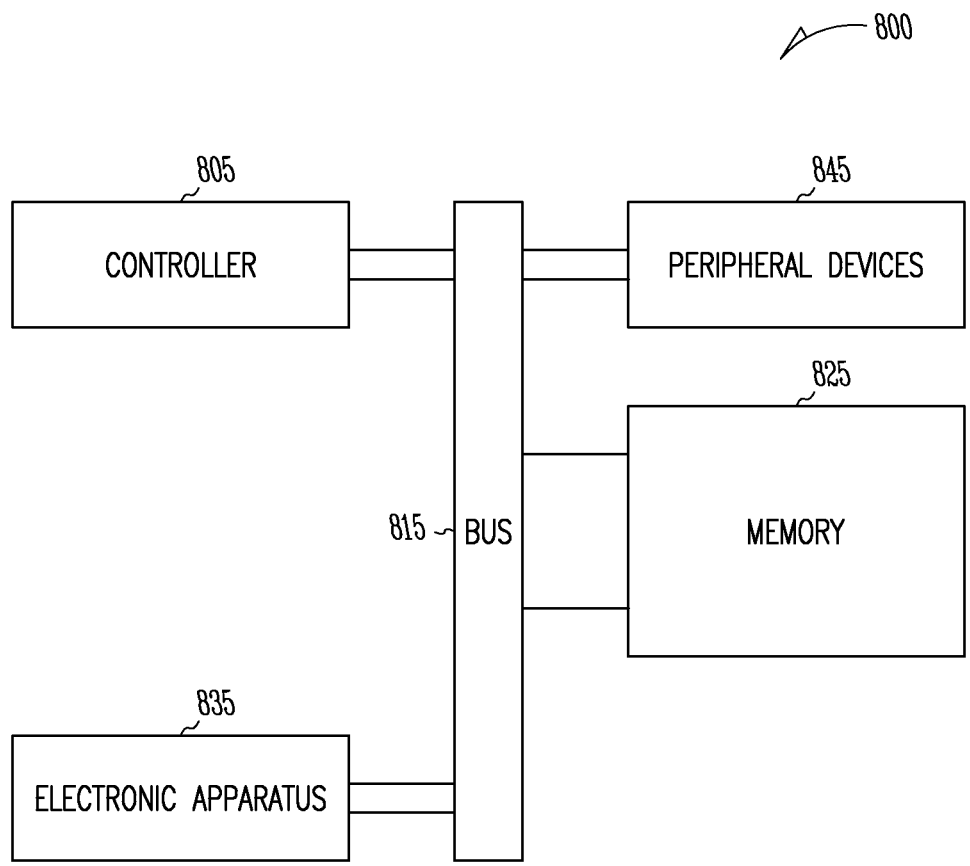
FIG. 8 illustrates a diagram for an embodiment of an electronic system having devices with a dielectric film containing a hafnium silicon oxynitride film and having a contact to the dielectric layer, where the contact contains a tantalum layer, a titanium nitride layer, or a combination of a tantalum layer and a titanium nitride layer.

FIG. 8 depicts a diagram of an embodiment of a system 800 having a controller 805 and a memory 825. Controller 805 may include a HfSiON$_x$ film structured as one or more monolayers with a tantalum electrode, a titanium nitride electrode, or an electrode having a combination of a tantalum and a titanium nitride, the tantalum and titanium nitride structured as one or more monolayers. Memory 825 may include a HfSiON$_x$ film structured as one or more monolayers with a tantalum electrode, a titanium nitride electrode, or an electrode having a combination of a tantalum and a titanium nitride, the tantalum and titanium nitride structured as one or more monolayers. Controller 805 and memory 825 may each include a HfSiON$_x$ film structured as one or more monolayers with a tantalum electrode, a titanium nitride electrode, or an electrode having a combination of a tantalum and a titanium nitride, the tantalum and titanium nitride structured as one or more monolayers. System 800 also includes an electronic apparatus 835 and a bus 815, where bus 815 provides electrical conductivity between controller 805 and electronic apparatus 835, and between controller 805 and memory 825. Bus 815 may include an address bus, a data bus, and a control bus, each independently configured. Alternatively, bus 815 may use common conductive lines for providing one or more of address, data, or control, the use of which is regulated by controller 805. In an embodiment, electronic apparatus 835 may be additional memory configured in a manner similar to memory 825. An embodiment may include an additional peripheral device or devices 845 coupled to bus 815. In an embodiment, controller 805 is a processor. One or more of controller 805, memory 825, bus 815, electronic apparatus 835, or peripheral devices 845 may include an embodiment of a dielectric layer having a HfSiON$_x$ film structured as one or more monolayers with a tantalum electrode, a titanium nitride electrode, or an electrode having a combination of a tantalum and a titanium nitride, the tantalum and titanium nitride structured as one or more monolayers. System 800 may include, but is not limited to, information handling devices, telecommunication systems, and computers.

Peripheral devices 845 may include displays, additional storage memory, or other control devices that may operate in conjunction with controller 805. Alternatively, peripheral devices 845 may include displays, additional storage memory, or other control devices that may operate in conjunction with memory 825, or controller 805 and memory 825.

Memory 825 may be realized as a memory device containing a HfSiON$_x$ film structured as one or more monolayers with a tantalum electrode, a titanium nitride electrode, or an electrode having a combination of a tantalum and a titanium nitride, the tantalum and titanium nitride structured as one or more monolayers. A HfSiON$_x$ structure with a Ta conductive layer, a TiN$_s$ conductive layer, or a combination of a Ta conductive layer and a TiN$_s$ conductive layer may be formed in a memory cell of a memory array. Such a structure may be formed in a capacitor in a memory cell of a memory array. Such a structure may be formed in a transistor in a memory cell of a memory array. It will be understood that embodiments are equally applicable to any size and type of memory circuit and are not intended to be limited to a particular type of memory device. Memory types include a DRAM, SRAM (Static Random Access Memory) or Flash memories. Additionally, the DRAM could be a synchronous DRAM commonly referred to as SGRAM (Synchronous Graphics Random Access Memory), SDRAM (Synchronous Dynamic Random Access Memory), SDRAM II, and DDR SDRAM (Double Data Rate SDRAM), as well as other emerging DRAM technologies.

Although specific embodiments have been illustrated and described herein, it will be appreciated by those of ordinary skill in the art that any arrangement that is calculated to achieve the same purpose may be substituted for the specific embodiments shown. It is to be understood that the above description is intended to be illustrative, and not restrictive, and that the phraseology or terminology employed herein is for the purpose of description and not of limitation. Combinations of the above embodiments and other embodiments will be apparent to those of skill in the art upon studying the above description.

What is claimed is:

1. A method comprising:
  forming a dielectric including hafnium silicon oxynitride, the hafnium silicon oxynitride being Hf$_x$Si$_y$O$_z$N$_r$ with x>0, y>0, z>0, and r>0;
  forming the hafnium silicon oxynitride doped with one or more elements other than hafnium or silicon, such that the hafnium silicon oxynitride is maintained as a hafnium silicon oxynitride structure, by using a monolayer or partial monolayer sequencing process and by substituting a sequence of the one or more elements for a hafnium sequence of a plurality of hafnium sequences or substituting a sequence of the one or more elements for a silicon sequence of a plurality of silicon sequences in the monolayer or partial monolayer sequencing process such that the one or more elements are included in a completed structure of the hafnium silicon oxynitride; and
  forming a conductive material coupled to the dielectric.

2. The method of claim 1, wherein forming the conductive includes forming titanium nitride coupled to the hafnium silicon oxynitride.

3. The method of claim 1, wherein forming the conductive includes forming tantalum coupled to the hafnium silicon oxynitride.

4. The method of claim 1, wherein forming the dielectric includes forming the dielectric as a nanolaminate.

5. The method of claim 1, wherein forming the conductive material includes forming the conductive material using the monolayer or partial monolayer sequencing process.

6. The method of claim 5, wherein using the monolayer or partial monolayer sequencing process includes using atomic layer deposition.

7. The method of claim 1, wherein forming hafnium silicon oxynitride includes:
   forming alternating layers of hafnium oxide and silicon nitride; and
   annealing the alternating layers of hafnium oxide and silicon nitride to form hafnium silicon oxynitride.

8. The method of claim 7, wherein annealing includes annealing in a nitrogen ambient.

9. The method of claim 1, wherein the method includes:
   forming tantalum as the conductive material coupled to the hafnium silicon oxynitride such that the tantalum is formed as a gate with the hafnium silicon oxynitride as a gate insulator in a PMOS transistor of a CMOS structure; and
   forming a titanium nitride as a gate on another region of hafnium silicon oxynitride in a NMOS transistor of the CMOS structure.

10. The method of claim 1, wherein forming the dielectric includes forming the dielectric essentially as the hafnium silicon oxynitride.

11. The method of claim 1, wherein forming the dielectric includes forming a stack of dielectrics.

12. The method of claim 11, wherein forming the stack of dielectrics includes forming an insulating metal oxide.

13. A method comprising:
   forming a memory having a dielectric including hafnium silicon oxynitride, the hafnium silicon oxynitride being $Hf_xSi_yO_zN_r$ with x>0, y>0, z>0, and r>0;
   forming the hafnium silicon oxynitride doped with one or more elements other than hafnium or silicon, such that the hafnium silicon oxynitride is maintained as a hafnium silicon oxynitride structure, by using a monolayer or partial monolayer sequencing process and substituting a sequence of the one or more elements for a hafnium sequence of a plurality of hafnium sequences or substituting a sequence of the one or more elements for a silicon sequence of a plurality of silicon sequences in the monolayer or partial monolayer sequencing process such that the one or more elements are included in a completed structure of the hafnium silicon oxynitride; and
   forming one or more of a titanium nitride or tantalum coupled to the dielectric.

14. The method of claim 13, wherein the method includes forming the dielectric as a nanolaminate containing silicon oxide as a charge storage region of the nanolaminate.

15. The method of claim 13, wherein the method includes forming titanium nitride as a gate with the hafnium silicon oxynitride as a gate insulator in a NMOS transistor and forming tantalum as a gate with a region of hafnium silicon oxynitride as a gate insulator in a PMOS transistor such that the NMOS transistor and the PMOS transistor have substantially symmetrical threshold voltages.

16. The method of claim 1, wherein hafnium silicon oxynitride is formed in each cycle of the monolayer or partial monolayer sequencing process.

17. The method of claim 1, wherein a number of hafnium sequence and a number of silicon sequences are conducted in each cycle of the monolayer or partial monolayer sequencing process such that the hafnium silicon oxynitride is formed being a hafnium-rich hafnium silicon oxynitride.

* * * * *

UNITED STATES PATENT AND TRADEMARK OFFICE
CERTIFICATE OF CORRECTION

PATENT NO.       : 8,785,312 B2
APPLICATION NO.  : 13/305338
DATED            : July 22, 2014
INVENTOR(S)      : Kie Y. Ahn et al.

Page 1 of 1

It is certified that error appears in the above-identified patent and that said Letters Patent is hereby corrected as shown below:

Title Page, Item (60), under "Related U.S. Application Data", in column 1, line 2, delete "May 30, 2010," and insert -- May 03, 2010, --, therefor.

Signed and Sealed this
Thirteenth Day of January, 2015

Michelle K. Lee
*Deputy Director of the United States Patent and Trademark Office*